US010748931B2

(12) United States Patent
Karda et al.

(10) Patent No.: US 10,748,931 B2
(45) Date of Patent: Aug. 18, 2020

(54) INTEGRATED ASSEMBLIES HAVING FERROELECTRIC TRANSISTORS WITH BODY REGIONS COUPLED TO CARRIER RESERVOIRS

(71) Applicant: Micron Technology, Inc., Boise, ID (US)

(72) Inventors: Kamal M. Karda, Boise, ID (US); Haitao Liu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 30 days.

(21) Appl. No.: 15/974,141

(22) Filed: May 8, 2018

(65) Prior Publication Data

US 2019/0348424 A1    Nov. 14, 2019

(51) Int. Cl.
*H01L 27/1159* (2017.01)
*H01L 29/78* (2006.01)
*H01L 29/66* (2006.01)
*H01L 29/51* (2006.01)
*H01L 29/10* (2006.01)

(52) U.S. Cl.
CPC ...... *H01L 27/1159* (2013.01); *H01L 29/1095* (2013.01); *H01L 29/516* (2013.01); *H01L 29/6684* (2013.01); *H01L 29/7827* (2013.01)

(58) Field of Classification Search
CPC ............... H01L 29/516; H01L 29/7827
See application file for complete search history.

(56) References Cited

U.S. PATENT DOCUMENTS

| 8,796,751 | B2 | 8/2014 | Ramaswamy et al. |
| 8,878,271 | B2 | 11/2014 | Karda et al. |
| 9,030,881 | B2 | 5/2015 | Tokuhira et al. |
| 9,293,556 | B2 | 3/2016 | van Bentum et al. |
| 9,324,406 | B2 | 4/2016 | Shuto et al. |
| 9,559,118 | B2 | 1/2017 | Karda et al. |
| 9,590,066 | B2 | 3/2017 | Ramaswamy et al. |
| 9,761,715 | B2 | 9/2017 | Ramaswamy et al. |
| 9,767,880 | B1 | 9/2017 | Carman |
| 2004/0266031 | A1* | 12/2004 | Inomata ............ H01L 27/11502 438/3 |

(Continued)

OTHER PUBLICATIONS

U.S. Appl. No. 16/043,653, filed Jul. 24, 2018 by Karda et al.

(Continued)

*Primary Examiner* — Jay C Chang
*Assistant Examiner* — Mikka Liu
(74) *Attorney, Agent, or Firm* — Wells St. John P.S.

(57) ABSTRACT

Some embodiments include an integrated assembly having a ferroelectric transistor body region between a first comparative digit line and a second comparative digit line. A carrier-reservoir structure is coupled with the ferroelectric transistor body region through an extension that passes along a side of the first comparative digit line. Some embodiments include an integrated assembly having a conductive structure over a carrier-reservoir structure. A bottom of the conductive structure is spaced from the carrier-reservoir structure by an insulative region. A ferroelectric transistor is over the conductive structure. The ferroelectric transistor has a bottom source/drain region over the conductive structure, has a body region over the bottom source/drain region, and has a top source/drain region over the body region. An extension extends upwardly from the carrier-reservoir structure, along a side of the conductive structure, and to a bottom of the body region. Some embodiments include methods of forming integrated assemblies.

23 Claims, 37 Drawing Sheets

(56) References Cited

U.S. PATENT DOCUMENTS

| | | | |
|---|---|---|---|
| 2006/0118844 A1* | 6/2006 | Kijima | H01L 29/516 257/295 |
| 2010/0302848 A1* | 12/2010 | Mikhalev | G11O 16/0483 365/185.05 |
| 2014/0340952 A1* | 11/2014 | Ramaswamy | G11O 11/221 365/51 |
| 2016/0207761 A1* | 7/2016 | Alam | H01L 29/515 |
| 2017/0133478 A1 | 5/2017 | Ramaswamy et al. | |
| 2017/0162587 A1 | 6/2017 | Chavan et al. | |
| 2018/0061835 A1 | 3/2018 | Yang et al. | |
| 2019/0181147 A1* | 6/2019 | Liu | G11O 11/2259 |

OTHER PUBLICATIONS

Mulaosmanovic et al., "Switching Kinetics in Nanoscale Hafnium Oxide Based Ferroelectric Field-Effect Transistors", ACS Applied Materials & Interfaces, vol. 9, 2017, United States, pp. 3792-3798.

Muller et al., "High Endurance Strategies for Hafnium Oxide Based Ferroelectric Field Effect Transistor", IEEE 16th Non-Volatile Memory Technology Symposium (NVMTS), Oct. 17-19, 2016, United States, 7 pages.

Yurchuk et al., "Impact of Scaling on the Performance of HfO2-Based Ferroelectric Field Effect Transistors", IEEE Transactions on Electron Devices vol. 61, No. 11, Nov. 2014, United States, pp. 3699-3706.

Zhang et al., "3.3 V Write-Voltage Ir/$Ca_{0.2}Sr_{0.8}Bi_2Ta_2O_9$/$HfO_2$/Si Ferroelectric-Gate Field-Effect Transistors with $10^9$ Endurance and Good Retention", Japanese Journal of Applied Physics vol. 56, Feb. 27, 2017. Japan, 5 pages.

Zhang et al., "64 kbit Ferroelectric-Gate-Transistor-Integrated NAND Flash Memory with 7.5 V Program and Long Data Retention", Japanese Journal of Applied Physics vol. 51, Apr. 20, 2012, Japan, 7 pages.

\* cited by examiner

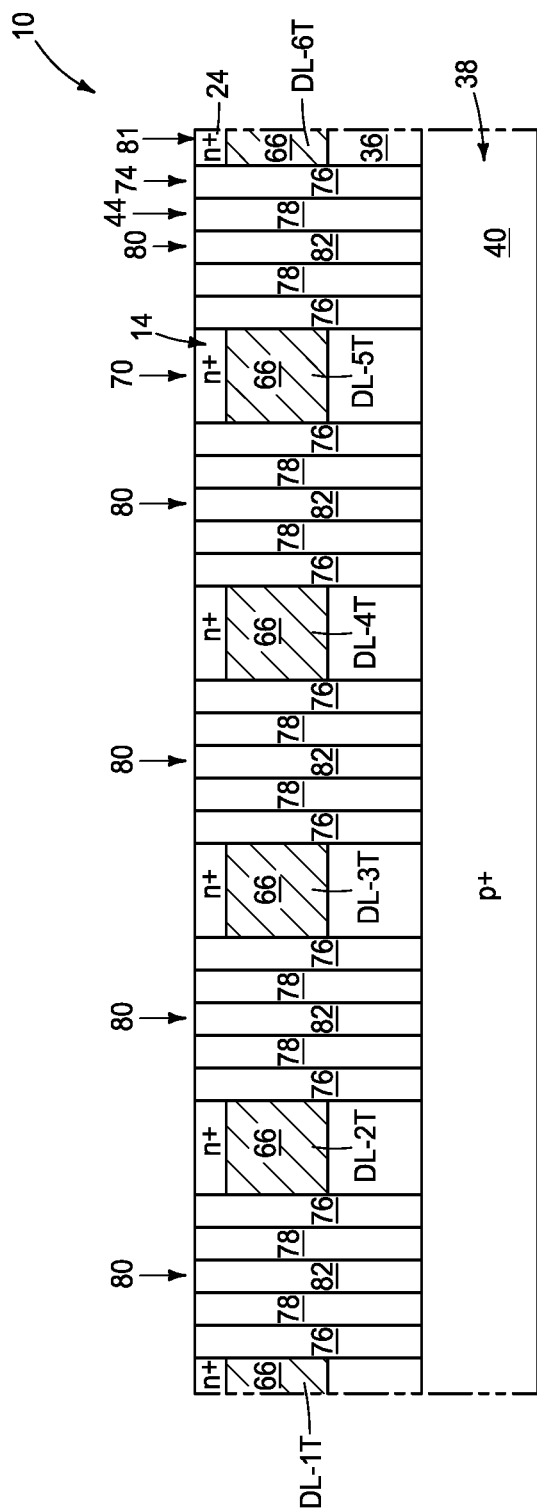

INTEGRATED ASSEMBLIES HAVING FERROELECTRIC TRANSISTORS WITH BODY REGIONS COUPLED TO CARRIER RESERVOIRS

TECHNICAL FIELD

Integrated assemblies having ferroelectric transistors with body regions coupled to carrier reservoirs; and methods of forming integrated assemblies.

BACKGROUND

Memory is one type of integrated circuitry, and is used in computer systems for storing data. Memory may be fabricated in one or more arrays of individual memory cells. Memory cells may be written to, or read from, using digit lines (which may also be referred to as bitlines, data lines, sense lines, or data/sense lines) and access lines (which may also be referred to as wordlines). The digit lines may conductively interconnect memory cells along columns of the array, and the access lines may conductively interconnect memory cells along rows of the array.

Memory cells may be volatile or nonvolatile. Nonvolatile memory cells can store data for extended periods of time including when the computer is turned off. Volatile memory dissipates and therefore requires being refreshed/rewritten, in many instances multiple times per second. Regardless, memory cells are configured to retain or store memory in at least two different selectable states. In a binary system, the states are considered as either a "0" or a "1". In other systems, at least some individual memory cells may be configured to store more than two levels or states of information.

Ferroelectric field effect transistors (FeFET) may be utilized as memory cells. Specifically, the FeFETs may have two selectable memory states corresponding to two different polarization modes of ferroelectric material within the FeFETS. The different polarization modes may be characterized by, for example, different threshold voltages (Vt) or by different channel conductivities for a selected operating voltage. The ferroelectric polarization mode of a FeFET may remain in the absence of power (at least for a measurable duration).

One type of ferroelectric transistor is a metal-ferroelectric-metal-insulator-semiconductor (MFMIS) transistor. Such has a gate dielectric (insulator, I) between metal (M) and a semiconductor substrate (S). Such also has ferroelectric (F) material over the metal, and has a gate (typically comprising metal, M) over the ferroelectric material. In operation, an electric field across the ferroelectric material is used to switch the ferroelectric material from one polarization mode to another. The ferroelectric transistor comprises a pair of source/drain regions, and a channel region between the source/drain regions. Conductivity across the channel region is influenced by the polarization mode of the ferroelectric material. Another type of ferroelectric transistor is metal-ferroelectric-insulator-semiconductor (MFIS); in which ferroelectric material directly touches the insulator (i.e., in which there is no intervening metal between the ferroelectric material and the insulator).

The channel region may be considered to be contained within a body region of the ferroelectric transistor. During programming operations, carriers (holes and electrons) migrate into and out of the body region.

It is desired to develop ferroelectric transistors which may be rapidly programmed, and yet which are scalable to ever-increasing levels of integration. It is proving difficult to achieve desired rapid programming with conventional ferroelectric transistor configurations.

It would be desirable to develop new ferroelectric transistors which address the above-discussed problem, and to develop new memory array architectures utilizing such transistors.

BRIEF DESCRIPTION OF THE DRAWINGS

FIG. 1 is a diagrammatic top view of the assembly. FIGS. 1A and 1B are diagrammatic cross-sectional side views along the lines A-A and B-B, respectively, of FIG. 1.

FIGS. 3A-13A are diagrammatic cross-sectional side views along the lines A-A of FIGS. 3-13.

FIGS. 3B-13B are diagrammatic cross-sectional side views along the lines B-B of FIGS. 3-13.

DETAILED DESCRIPTION OF THE ILLUSTRATED EMBODIMENTS

Figure 1:
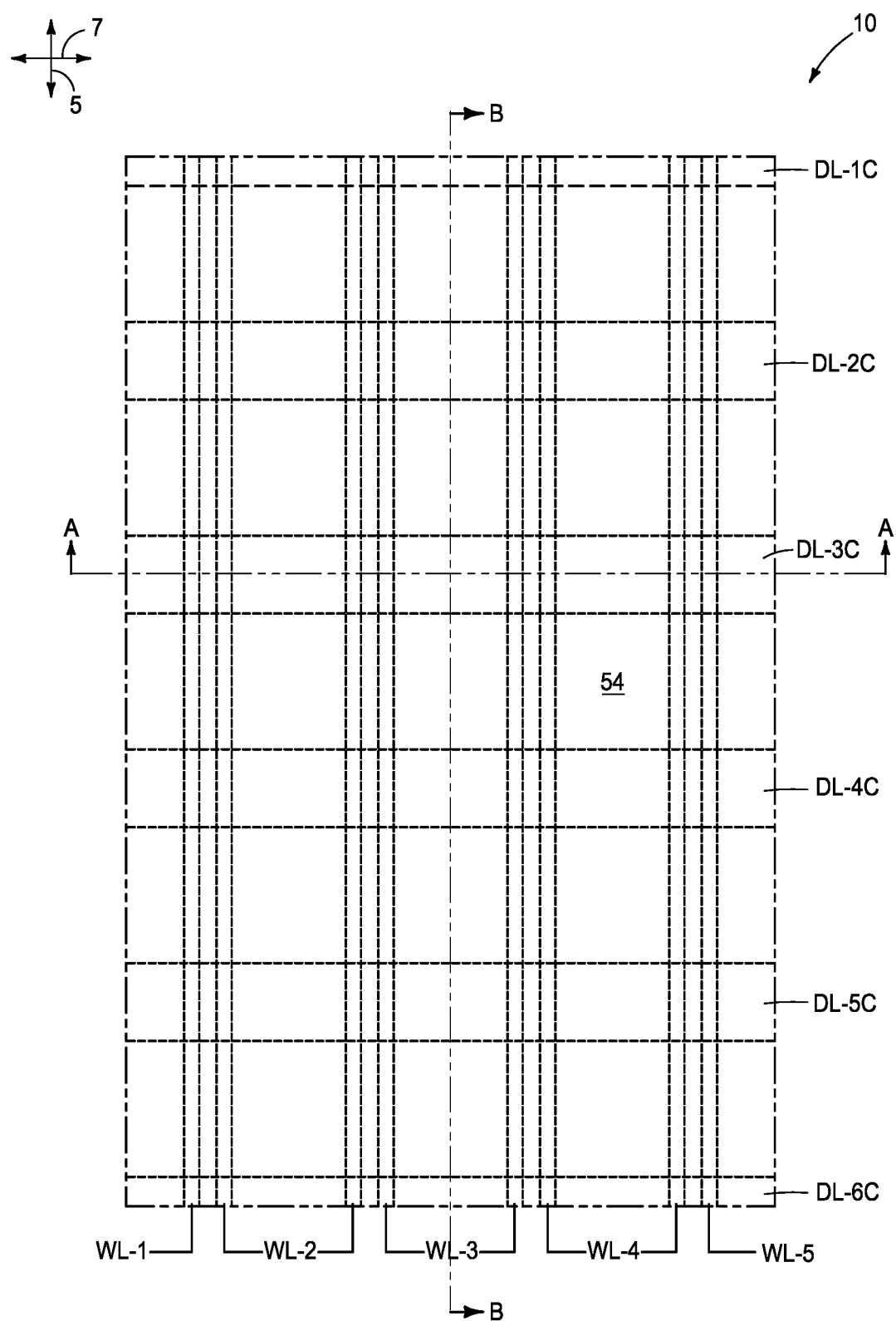
FIGS. 1, 1A and 1B are views of a region of an example assembly comprising example memory cells of an example memory array.

Some embodiments include recognition that a problem with conventional ferroelectric transistors is that the body regions of such transistors are "floating", and specifically are isolated from a source of carrier (either holes or electrons). Such can become problematic during programming operations, in that a limiting factor in the speed of the programming operations may be the rate at which carrier is refreshed within the body regions of the transistors. The ferroelectric transistors may be p-channel devices (i.e., may have p-type source/drain regions, and have the channels operated to conduct holes between the p-type source/drain regions), or may be n-channel devices (i.e., may have n-type source/drain regions, and have the channels operated to conduct electrons between n-type source/drain regions). The source/drain regions may provide one type of carrier to the body region of a ferroelectric transistor during programming operations (holes for p-channel devices, electrons for n-channel devices), but the other type of carrier will come from bulk material adjacent the body region. In conventional structures, the floating body region is too isolated from the bulk material for rapid replenishment of such other type of carrier; and performance suffers. Some embodiments include a reservoir of the other carriers. The reservoir is directly coupled with the body regions of ferroelectric transistors to improve performance (e.g., to increase programming speed). Example embodiments are described with reference to FIGS. 1-13.

As a preliminary matter, it is noted that some of the figures show various different dopant levels; and utilize some or all of the designations p+, p, p−, n−, n and n+ to distinguish the levels. The difference in dopant concentration between the regions identified as being p+, p, and p− are typically as follows. A p+ region has a dopant concentration of at least about $10^{20}$ atoms/cm$^3$, a p region has a dopant concentration of from about $10^{14}$ to about $10^{18}$ atoms/cm$^3$, and a p− region has a dopant concentration in the order of or less than $10^{16}$ atoms/cm$^3$. Regions identified as being n−, n and n+ will have dopant concentrations similar to those described above relative to the p−, p and p+ regions respectively, except, of course, the n regions will have an opposite-type conductivity-enhancing dopant therein than do the p regions. It is noted that the terms "p" and "n" can be utilized herein to refer to both dopant type and relative dopant concentrations. The terms "p" and "n" are to be understood as referring only to dopant type, and not to a relative dopant concentration, except when it is explicitly stated that the terms refer to relative dopant concentrations. Accordingly, for purposes of interpreting this disclosure and the claims that follow, it is to be understood that the term "p-type doped" and "n-type doped" refer to dopant types of a region and not to relative dopant levels. Thus, a p-type doped region can be doped to any of the p+, p, and p− dopant levels discussed above, and similarly an n-type doped region can be doped to any of the n+, n, and n− dopant levels discussed above.

Figure 1A:
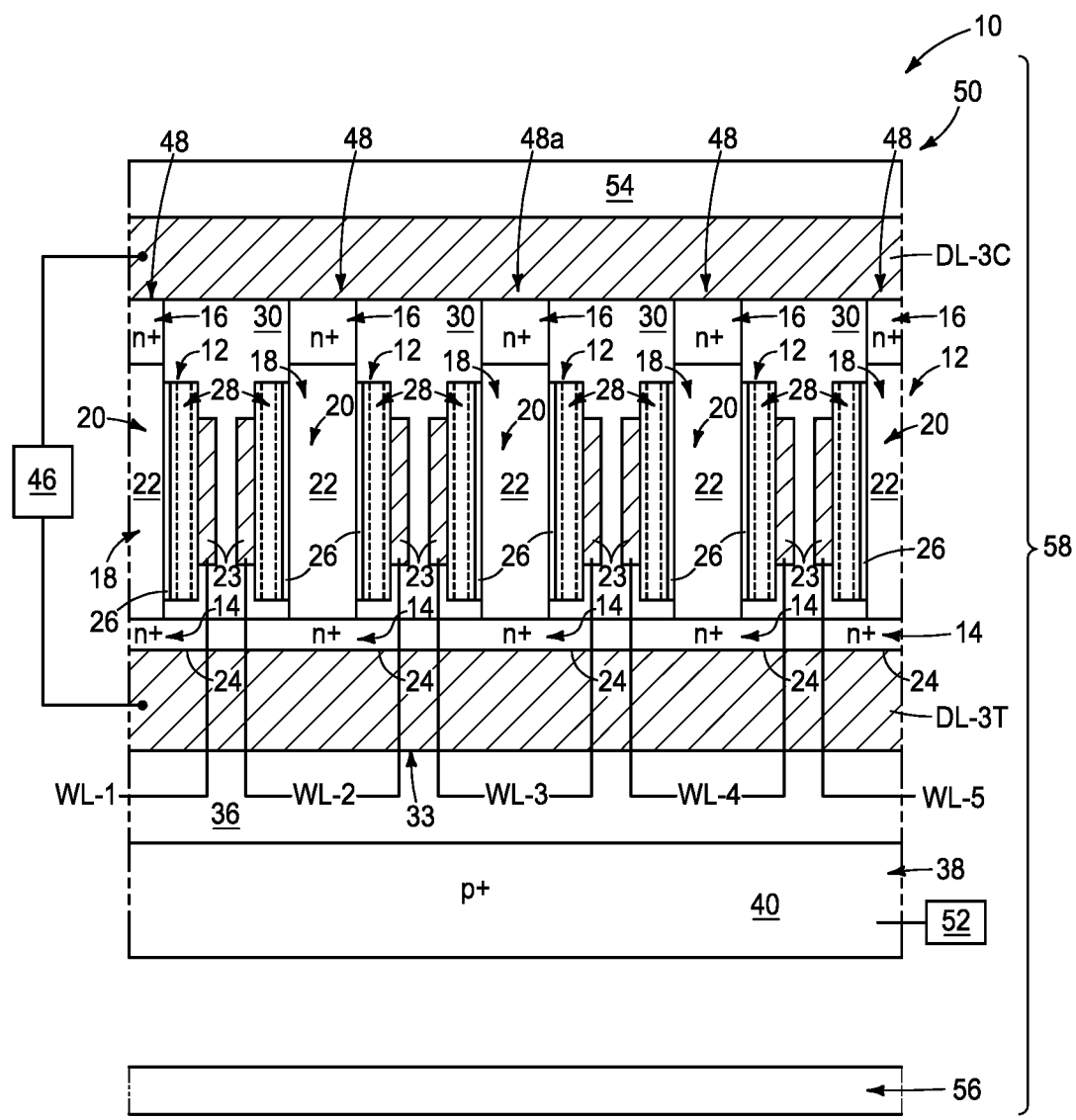
Figure 1B:
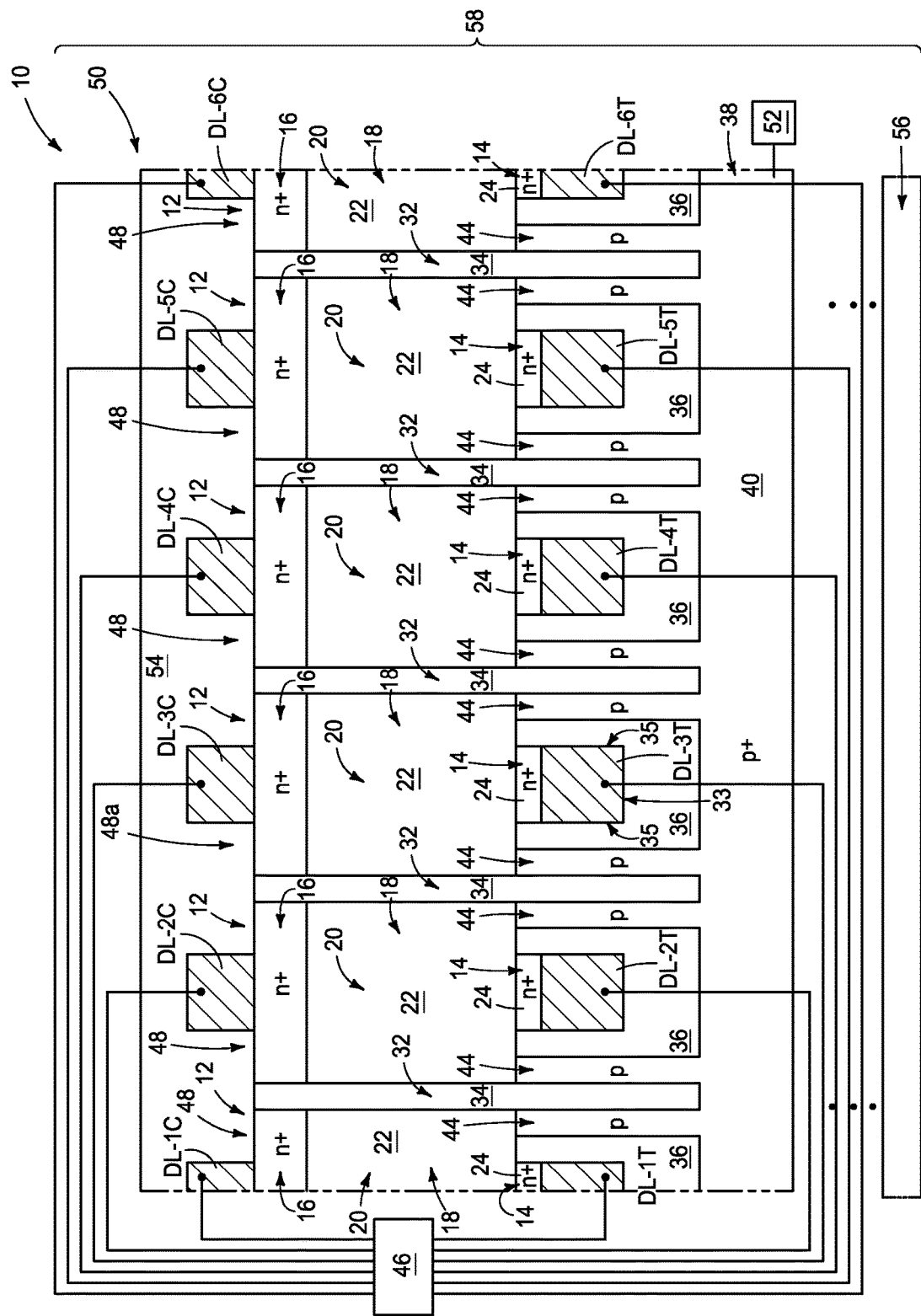

Referring to FIGS. 1-1B, a region of an integrated assembly 10 is shown in top view (FIG. 1) and a pair of cross-sectional side views (FIGS. 1A and 1B). The construction includes a plurality of wordlines (WL-1, WL-2, WL-3, WL-4 and WL-5), with such wordlines being shown in dashed-line (i.e. phantom) view in the top view of FIG. 1 to indicate that they are beneath other materials. Each of the wordlines comprises a pair of conductive structures which extend parallel to one another. The conductive structures of each wordline are coupled to one another in a location outside of the views of FIGS. 1-1B.

The construction also includes a plurality of comparative digit lines arranged in paired sets (DL-1T/DL-1C, DL-2T/DL-2C, DL-3T/DL-3C, DL-4T/DL-4C, DL-5T/DL-5C and DL-6T/DL-6C). Each paired set may be considered to comprise a true digit line (e.g., DL-1T) and a complementary digit line (e.g., DL-1C). The terms "true" and "complementary" are arbitrary. The electrical values of the true and complementary digit lines of an individual set (e.g., the electrical values of DL-1T and DL-1C) are utilized together during reading/writing operations of memory cells associated with such set. The complementary digit lines (e.g., DL-1C) are shown in dashed-line view in the top view of FIG. 1 to indicate that they are beneath other materials. In some embodiments, the true comparative digit lines (e.g., DL-1T) may be referred to as first comparative digit lines, and the complementary comparative digit lines (e.g. DL-1C) may be referred to as second comparative digit lines.

The wordlines (e.g., WL-1) extend along a first direction represented by an axis 5 (shown along the top view of FIG. 1), and the comparative digit lines (e.g., DL-1C) extend along a second direction represented by an axis 7 (also shown along the top view of FIG. 1). The second direction of axis 7 crosses the first direction of axis 5. In the illustrated embodiment, the second direction of axis 7 is substantially orthogonal to the first direction of axis 5 (with the term "substantially orthogonal" meaning orthogonal to within reasonable tolerances of fabrication and measurement). The terms "first direction" and "second direction" are arbitrary; and in some embodiments the direction of axis 7 may be referred to as the first direction, while the direction of axis 5 is referred to as the second direction.

Ferroelectric transistors 12 are arranged in an array. In some embodiments, the wordlines (e.g., WL-1) may be considered to extend along rows of such array, and the comparative digit lines (e.g., DL-1T) may be considered to extend along columns of the array.

Each ferroelectric transistor comprises a lower (i.e. bottom) source/drain region 14 and an upper (i.e. top) source/drain region 16. In some embodiments, one of the lower and upper source/drain regions of an individual ferroelectric transistor 12 may be referred to as a first source/drain region, and the other may be referred to as a second source/drain region.

In the illustrated embodiment, the source/drain regions 14 and 16 are shown to be n-type doped; and accordingly the ferroelectric transistors 12 are n-channel devices. In other embodiments, the source and drain regions 14 and 16 may be p-type doped so that the ferroelectric transistors 12 are p-channel devices. The upper source/drain regions 16 are electrically coupled with the upper comparative digit lines (e.g., DL-3C); and in the shown embodiment are directly against bottom surfaces of the upper comparative digit lines. The lower source/drain regions 14 are electrically coupled with the lower comparative digit lines (e.g., DL-3T); and in the shown embodiment are directly against top surfaces of the lower comparative digit lines.

Each ferroelectric transistor has a body region 18 between the source/drain regions 14 and 16. In some embodiments, the upper source/drain regions 16 and body regions 18 may be comprised by vertical pillars 20 of semiconductor material 22. The bottom source/drain regions 14 extend within lines of semiconductor material 24. The semiconductor materials 22 and 24 may comprise any suitable semiconductor materials; including, for example, one or more of silicon, germanium, III/V semiconductor material (e.g., gallium phosphide), semiconductor oxides, etc. The term "III/V semiconductor material" refers to semiconductor material having elements selected from groups III and V of the periodic table. The semiconductor material 22 and 24 may be a same composition as one another or may be different compositions relative to one another. In some embodiments, the semiconductor materials 22 and 24 both comprise, consist essentially of, or consist of silicon. Junctions between the source/drain regions (14, 16) and the body regions (18) may be in any suitable locations.

The body regions 18 of each of the ferroelectric transistors 12 are between a first comparative digit line (e.g., DL-3T) and a second comparative digit line (DL-3C).

The wordlines (e.g., WL-2) comprise conductive wordline material 23. Such conductive material may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.).

The wordlines (e.g., WL-2) are adjacent the transistor body regions 18; and are spaced from the body regions 18 by intervening regions comprising gate dielectric material 26 and MFM stacks 28 (as shown in FIG. 1A).

The gate dielectric material 26 may comprise any suitable composition(s); and in some embodiments may comprise one or more of silicon dioxide, high-k dielectric material and low-k dielectric material (with the term high-k meaning a dielectric constant greater than that of silicon dioxide, and the term low-k meaning a dielectric constant lower than that of silicon dioxide).

The MFM stacks 28 comprise ferroelectric material between a pair of metal-containing materials. The individual materials within the MFM stacks 28 are not labeled in order to simplify the drawing, and instead approximate boundaries between the various materials within the stacks 28 are diagrammatically indicated with dashed-lines. The metal-containing materials within the MFM stacks 28 may comprise any suitable metals or metal-containing compositions; including, for example, one or more of tungsten, titanium, titanium nitride, etc. The ferroelectric material within the stacks 28 may comprise any suitable composition or combination of compositions; and may, for example, comprise, consist essentially of, or consist of one or more materials selected from the group consisting of transition metal oxide, zirconium, zirconium oxide, hafnium, hafnium oxide, lead zirconium titanate, tantalum oxide, and barium strontium titanate; and having dopant therein which comprises one or more of silicon, aluminum, lanthanum, yttrium, erbium, calcium, magnesium, strontium, and a rare earth element. The ferroelectric material may be provided in any suitable configuration; such as, for example, a single homogeneous material, or a laminate of two or more discrete separate materials. The MFM stacks be utilized in MFMIS configurations. In some embodiments, the MFM stacks may be replaced with MF stacks suitable for utilization in MFIS configurations.

Insulative material 30 is over and between the wordlines (as shown in FIG. 1A). The insulative material 30 may comprise any suitable composition(s); and in some embodiments may comprise, consist essentially of, or consist of silicon oxide. The insulative material 30 is configured as lines extending along a same direction as the wordlines (e.g., WL-2). The insulative material 30 separates transistor body regions 18 from one another along the cross-section of FIG. 1A.

FIG. 1B shows insulative panels 32 separating the transistor body regions 18 from one another along the illustrated cross-section. Such panels may extend linearly along the same direction as the comparative digit lines (e.g., DL-2C). The panels 32 comprise insulative material 34. The insulative material 34 may comprise any suitable composition(s); and in some embodiments may comprise, consist essentially of, or consist of silicon oxide.

The lower digit lines (e.g., DL-3T) each comprise a bottom surface 33 and sidewall surfaces 35 (labeled only relative to the digit line DL-3T in order to simplify the drawings). The lower digit lines (e.g., DL-3T) extend into an insulative material 36. Accordingly, regions of the insulative material 36 are beneath the lower digit lines, and other regions of the insulative material 36 are along the sidewall surfaces 35 of the lower digit lines.

A carrier-reservoir structure 38 is beneath the insulative material 36. In some embodiments, the lower digit lines (e.g., DL-3T) may be considered to be examples of conductive structures which are over the carrier structure 38. In the shown embodiment, such conductive structures are spaced from the carrier-reservoir structure 38 by insulative regions comprising the insulative material 36.

The carrier-reservoir structure may be a source of desired carriers (e.g., holes or electrons). In the illustrated embodiment in which the ferroelectric transistors 12 are n-channel devices, the reservoir 38 is p-type doped and configured as a reservoir of holes. In other embodiments in which the ferroelectric transistors are p-channel devices, the reservoir 38 will be n-type doped and configured as a reservoir of electrons.

The carrier-reservoir structure 38 comprises semiconductor material 40. The semiconductor material 40 may comprise any suitable composition(s); including, for example, one or more of silicon, germanium, III/V semiconductor material, semiconductor oxides, etc. The semiconductor material 40 may comprise a same semiconductor composition as the material 22 of the transistor body regions 18, or may comprise a different semiconductor composition relative to the material 22 of the transistor body regions. In some embodiments, the semiconductor materials 22 and 40 may both comprise, consist essentially of, or consist of silicon.

The semiconductor material 40 of the carrier-reservoir structure 38 is shown doped to a p+ dopant level; and in some embodiments may be doped to a concentration of at least about $1 \times 10^{20}$ atoms/cm$^3$ with one or more appropriate p-type dopants.

Extension regions (also referred to herein simply as extensions) 44 extend from the carrier-reservoir structure 38 to the transistor body regions 18, as shown in FIG. 1B. The extension regions 44 are shown comprising a same semiconductor material 40 as the carrier-reservoir structure 38. In other embodiments, the extension regions 44 may comprise a different semiconductor material than the reservoir structure 38.

The extension regions 44 are shown doped to a "p" dopant level. In some embodiments, the extension regions 44 may be doped to a concentration of at least about $1 \times 10^{17}$ atoms/cm$^3$ with one or more appropriate p-type dopants. In some embodiments, the insulative material 36 along the sidewalls 35 of the comparative digit lines (e.g., DL-3T) may be omitted so that the extension regions 44 directly contact the sidewalls 35. In such embodiments, it may be desirable to keep the dopant level within the extension regions relatively low (i.e., for instance, within a range of from about $1 \times 10^{17}$ atoms/cm$^3$ to about $5 \times 10^{18}$ atoms/cm$^3$) in order to reduce possible Zener leakage between the comparative digit lines (e.g., DL-3T) and the extensions 44. In the shown embodiment in which the insulative material 36 spaces the extension regions 44 from sidewalls 35 of the digit lines (e.g., DL-3T), the extension regions may have higher levels of dopant; and may, for example, have dopant levels of at least about $1 \times 10^{20}$ atoms/cm$^3$.

The extension regions 44 have a same dopant type as the carrier-reservoir structure 38. Accordingly, in some embodiments the extension regions 44 may be p-type (as shown), and in other embodiments they may be n-type.

The true and complementary comparative digit lines (e.g., DL-1T and DL-1C) of each of the paired digit line sets (e.g., DL-1T/DL-1C) are electrically coupled with a device 46. Such device 46 may be a sense amplifier utilized to compare electrical properties of a true digit line (e.g., DL-1T) with those of a comparative digit line (e.g., DL-1C) during a READ operation. Alternatively, or additionally, the device 46 may be utilized to impart desired electrical properties to the true and complementary comparative digit lines (e.g., DL-1T and DL-1C) during a programming (i.e., WRITE) operation. Although all of the paired digit line sets (e.g., DL-1T/DL-1C) are shown extending to the same device 46, in other embodiments one or more of the digit line sets may extend to a different device than do others of the digit line sets.

Each of the ferroelectric transistors 12 may be considered to be comprised by a memory cell 48; with such memory cells together forming a memory array 50. Each memory cell is uniquely addressed by one set of true/complementary digit lines (e.g., DL-3T/DL-3C) and one of the wordlines (e.g., WL-3).

One of the memory cells 48 is designated as a memory cell 48a for purposes of describing operation of the memory cells. It is to be understood that the label 48a is not utilized to indicate any difference between the memory cell 48a and the other memory cells 48; and generally all of the memory cells would be substantially identical to one another (with the term "substantially identical" meaning identical to within reasonable tolerances of fabrication and measurement).

The memory cell 48a may be programmed into a first memory state (a so-called "1" state) by operating the wordline WL-3 and a digit line set DL-3T/DL-3C to form electrons within the body region 18 (and specifically along a channel region adjacent the wordline WL-3). In the illustrated embodiment in which the memory cell 48a comprises the illustrated n-channel ferroelectric transistor 12, the electrons may be provided by the n-type doped source/drain regions 14 and 16. The memory cell 48a may be programmed into a second memory state (a so-called "0" state) by operating the wordline WL-3 and a digit line set DL-3T/DL-3C to form holes within the body region 18 (and specifically along the channel region adjacent the wordline WL-3). In the illustrated embodiment in which the memory cell 48a comprises the illustrated n-channel ferroelectric transistor 12, the holes may be provided from the carrier-reservoir structure 38 by diffusing such holes through the extensions 44. Accordingly, the extensions 44 are configured to provide carriers from the carrier-reservoir structure 38 to the body regions 18.

The carrier-reservoir structure 38 is shown to be coupled to a device 52 which provides appropriate electrical properties to the carrier-reservoir structure 38 to enable carriers to readily flow to the body regions 18 during programming operations. In the illustrated embodiment in which the carriers provided by the carrier-reservoir structure are holes, the device 52 may provide a reference voltage less than zero (i.e., a negative reference voltage). In other embodiments, the ferroelectric transistors 12 may be p-channel devices and the carriers provided by the carrier-reservoir structure may be electrons. In such embodiments, the device 52 may provide a reference voltage greater than zero (i.e., a positive reference voltage). In some embodiments, the carrier-reservoir structure may be held other suitable references voltages than those described above; such as, for example, a reference voltage of about ground.

In the shown embodiment, the upper comparative digit lines (e.g., DL-3C) are covered by insulative material 54. Such insulative material may comprise any suitable composition or combination of compositions; and in some embodiments may comprise, consist essentially of, or consist of silicon dioxide.

The memory array 50 is supported by a base 56. The base 56 may comprise semiconductor material; and may, for example, comprise, consist essentially of, or consist of monocrystalline silicon. The base 56 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 56 may correspond to a semiconductor substrate containing one or more materials associated with integrated circuit fabrication. Such materials may include, for example, one or more of refractory metal materials, barrier materials, diffusion materials, insulator materials, etc.

A gap is provided between the base 56 and the carrier-reservoir structure 38 to indicate that there may be other materials and/or components between the base 56 and the carrier-reservoir structure 38. However, it is to be understood that the semiconductor material 40 of the carrier-reservoir structure 38 may be coextensive with semiconductor material of the base 56 in some embodiments.

Figure 2:
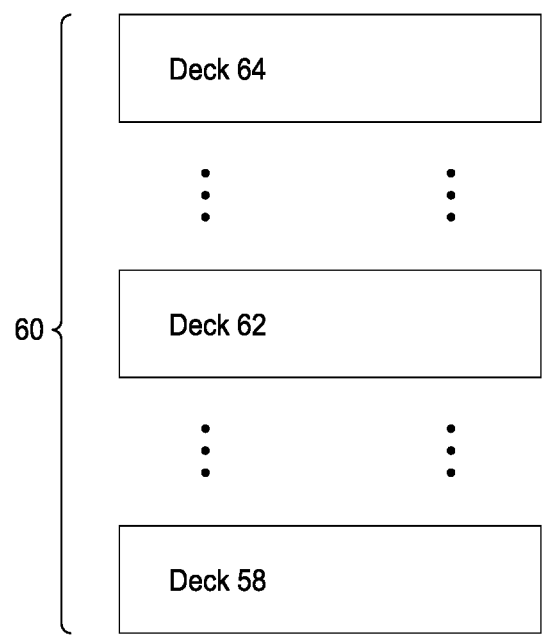
FIG. 2 is a diagrammatic cross-sectional side view of an example multi-deck assembly.

The memory array 50 may be considered to be comprised by a deck 58 in some embodiments. Such deck may be referred to as a memory deck if the primary application of such deck is memory. The devices 46 and 52 may or may not be part of the deck 58; and the base 56 may or may not be part of the deck 58. The deck 58 may be part of a multi-deck architecture (assembly) 60 as shown in FIG. 2. Specifically, the illustrated multi-deck architecture comprises deck 58 together with two other decks 62 and 64. Generally, the multi-deck architecture will comprise at least one other deck in addition to the deck 58. The other deck may or may not be a memory deck. If the other deck comprises memory, such memory may utilize memory cells having ferroelectric transistors analogous to the transistors 12 of FIGS. 1-1B. In such embodiments, the memory cells 48 of the deck 58 may be referred to as first memory cells having first ferroelectric transistor body regions, and the memory cells of the additional deck may be referred to as second memory cells having second ferroelectric transistor body regions.

The deck 58 is shown to be the bottom-most deck in the multi-deck architecture 60 of FIG. 2, but it is to be understood that the deck 58 may be in any suitable location relative to other decks in a multi-deck architecture.

The integrated assembly of FIGS. 1-1B may be formed with any suitable processing. FIGS. 3-13 illustrate example processing.

Figure 3:
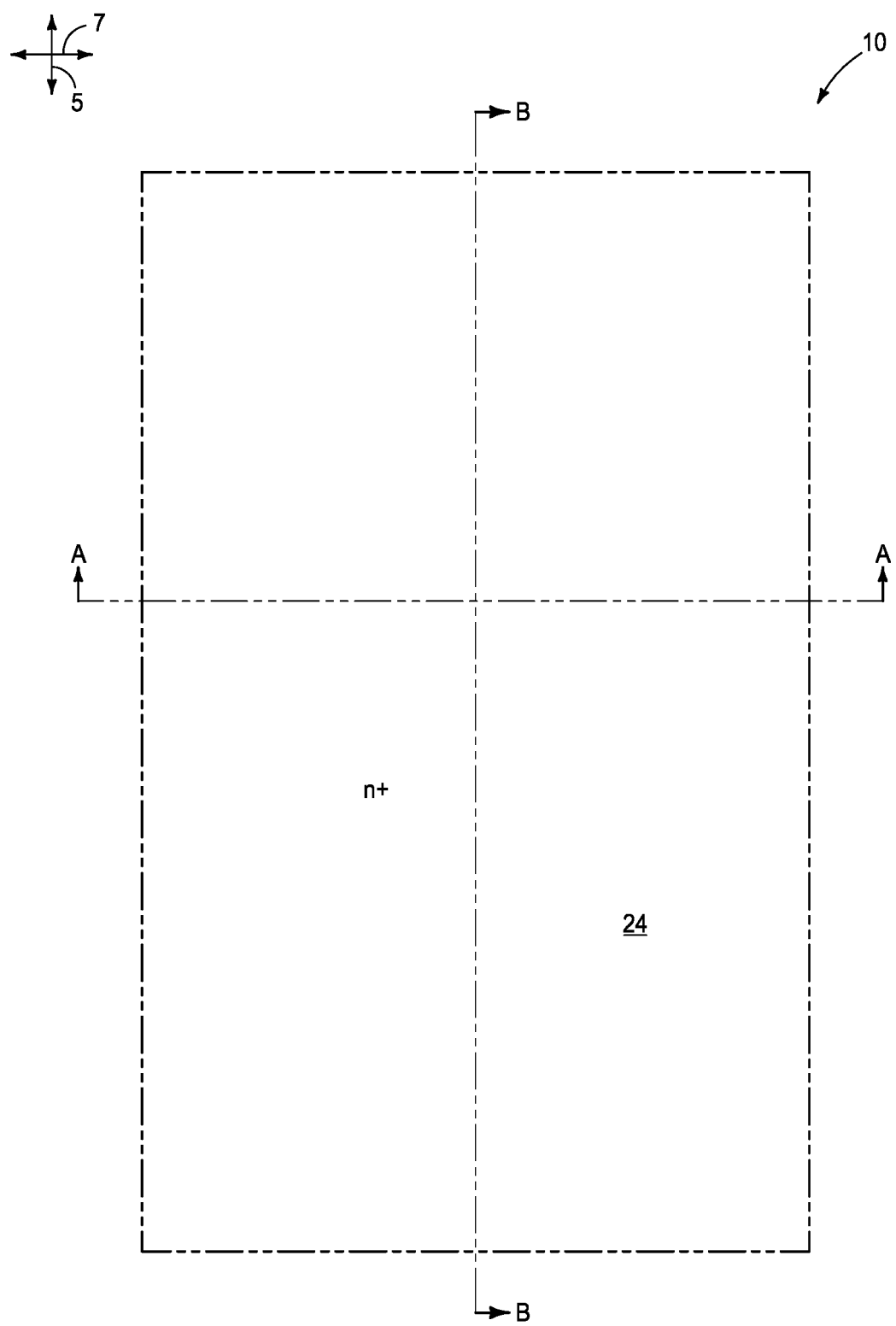
FIGS. 3-13 are diagrammatic top views of an example construction at example process stages of an example method for fabricating an example assembly comprising an example memory array.
Figure 3A:
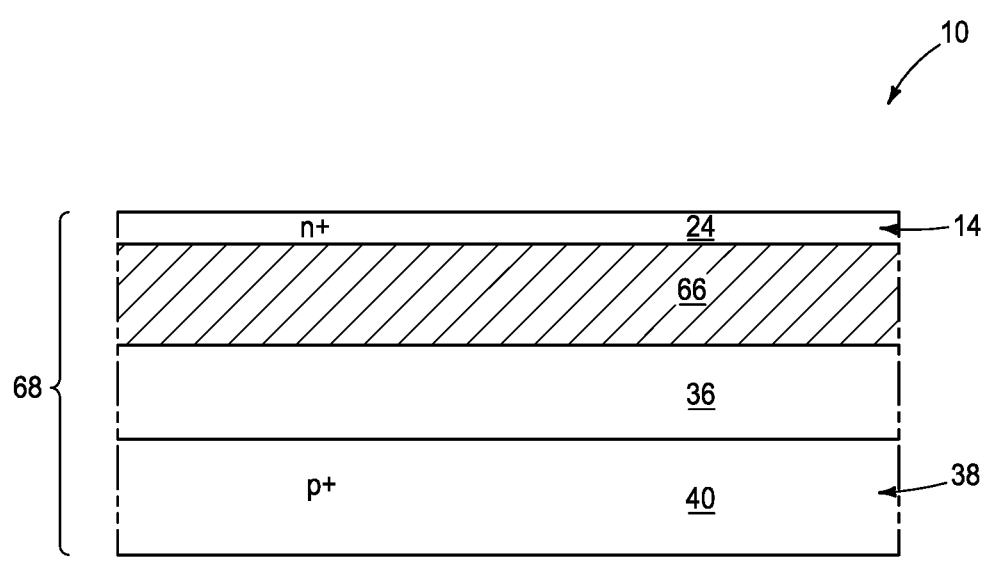
Figure 3B:
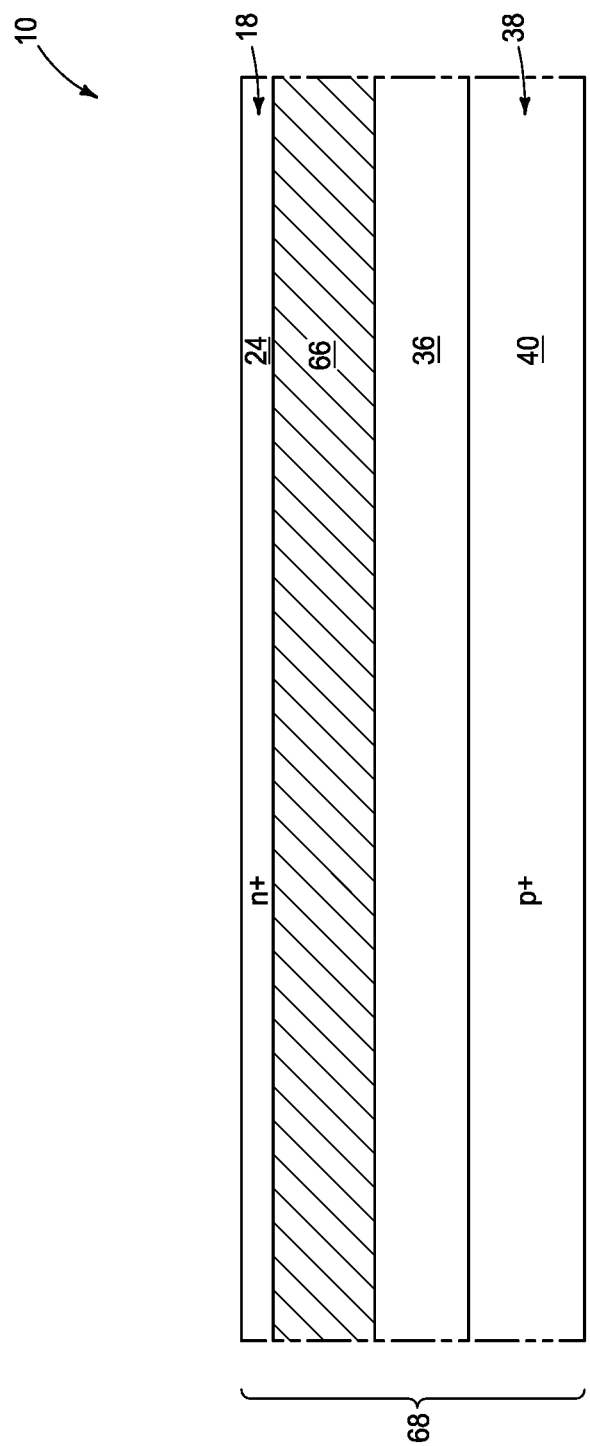

Referring to FIGS. 3-3B, the assembly 10 is shown at a process stage which may be utilized during fabrication of the memory array 50 described above with reference to FIGS. 1-1B. The assembly 10 of FIGS. 3-3B includes the semiconductor material 40 of the carrier-reservoir structure 38, the insulative material 36, conductive digit-line material 66, and the semiconductor material 24. In some embodiments, the materials 40, 36, 66 and 24 may be considered to be within a stack 68. In some embodiments, such stack may be considered to comprise, in ascending order, a first semiconductor material 40, an insulative material 36, conductive digit-line material 66, and a second semiconductor material 24.

The semiconductor materials 40 and 24 are shown to be p-type doped and n-type doped, respectively, to ultimately form a construction of the type described above with reference to FIGS. 1-1B having n-channel ferroelectric transistors; but it is to be understood that in other embodiments the dopant types of the materials 40 and 24 could be reversed so that material 40 is n-type doped and material 24 is p-type doped, and ultimately the construction which is formed will have p-channel ferroelectric transistors instead of the n-channel ferroelectric transistors. The material 24 is appropriately doped to be utilized in lower source/drain regions 14 of the type described above with reference to FIGS. 1-1B.

The digit-line material 66 may comprise any suitable electrically conductive composition(s), such as, for example, one or more of various metals (e.g., titanium, tungsten, cobalt, nickel, platinum, ruthenium, etc.), metal-containing compositions (e.g., metal silicide, metal nitride, metal carbide, etc.), and/or conductively-doped semiconductor materials (e.g., conductively-doped silicon, conductively-doped germanium, etc.). In some embodiments, the digit-line material will comprise metal (e.g., one or more of titanium, titanium nitride, titanium silicide, tungsten, tungsten nitride, tungsten silicide etc.), and will be referred to as a metal-containing-digit-line material.

The carrier-reservoir structure 38 is not shown coupled to the device 52 (described above with reference to FIGS. 1-1B) at the processing stage of FIGS. 3-3B. Such coupling may be present at the processing stage of FIGS. 3-3B in some embodiments, and may be provided at a later processing stage in other embodiments.

The base 56 described above with reference to FIGS. 1-1B is not shown at the processing stage of FIGS. 3-3B in order to simplify the drawings, but it is to be understood that such base may be present.

Figure 4:
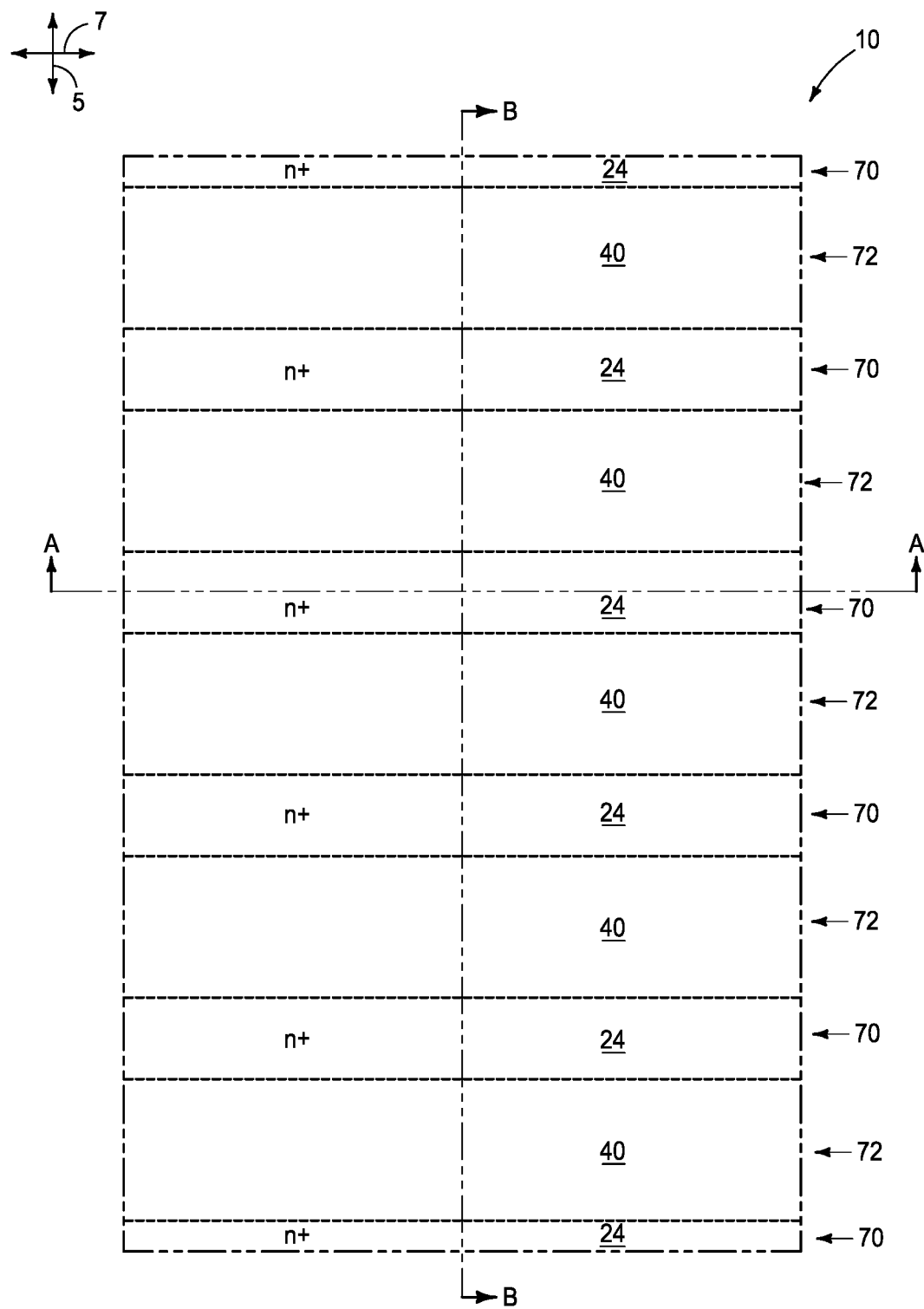
Figure 4A:
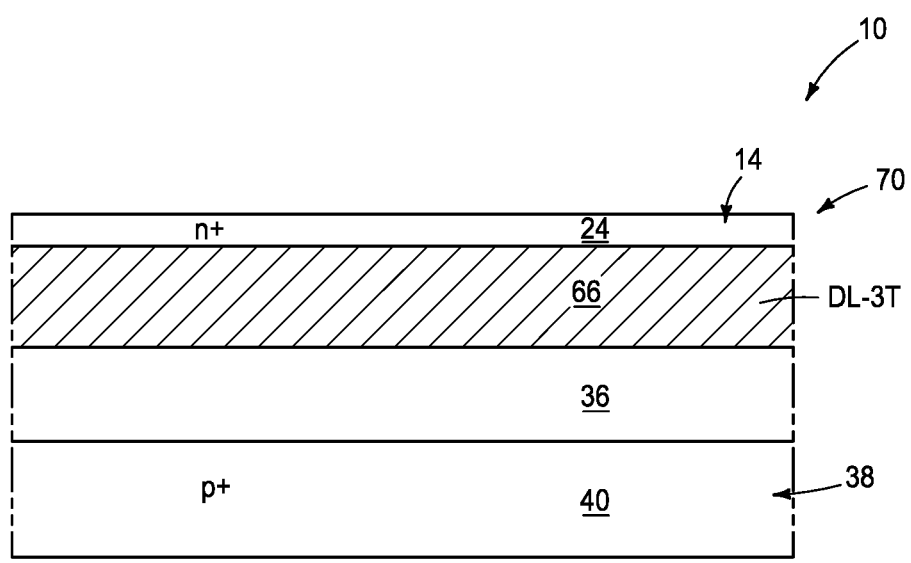
Figure 4B:
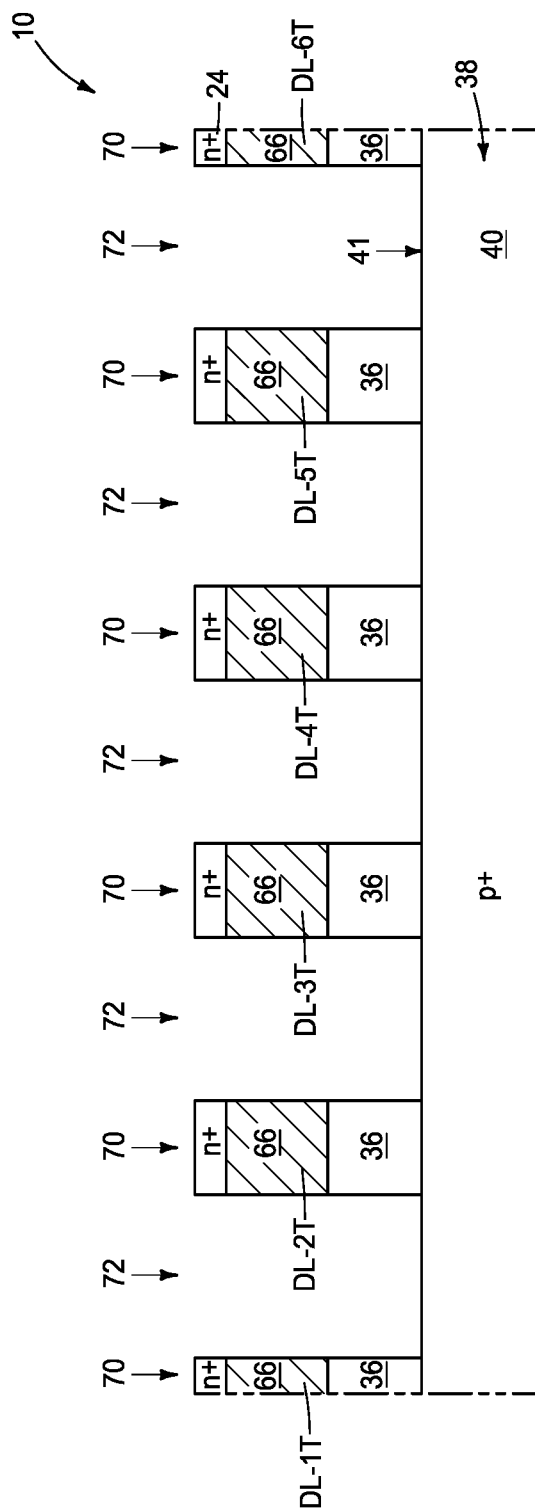

Referring to FIGS. 4-4B, the materials 36, 66 and 24 are patterned into rails 70 extending along the direction of axis 7 (with such axis being shown relative to the top view of FIG. 4). The materials may be patterned utilizing any suitable methodology. For instance, a mask (not shown) may be provided over construction 10 to define locations of the rails, then one or more suitable etches may be utilized to pattern the rails, and finally the mask may be removed to leave the illustrated construction of FIGS. 4-4B. In some embodiments, at least a portion of the mask may remain at the processing stage of FIGS. 4-4B to protect an upper surface of the semiconductor material 24 during subsequent process stages.

The rails 70 are spaced from one another by gaps 72. The gaps 72 extend to an upper surface 41 of the semiconductor material 40, and expose such upper surface. In some embodiments, the exposed upper surface of material 40 may be considered to be along bottom peripheries of the gaps 72.

The formation of rails 70 patterns the digit-line material 66 into the first comparative digit lines DL-1T, DL-2T, DL-3T, DL-4T, DL-5T and DL-6T.

Figure 5:
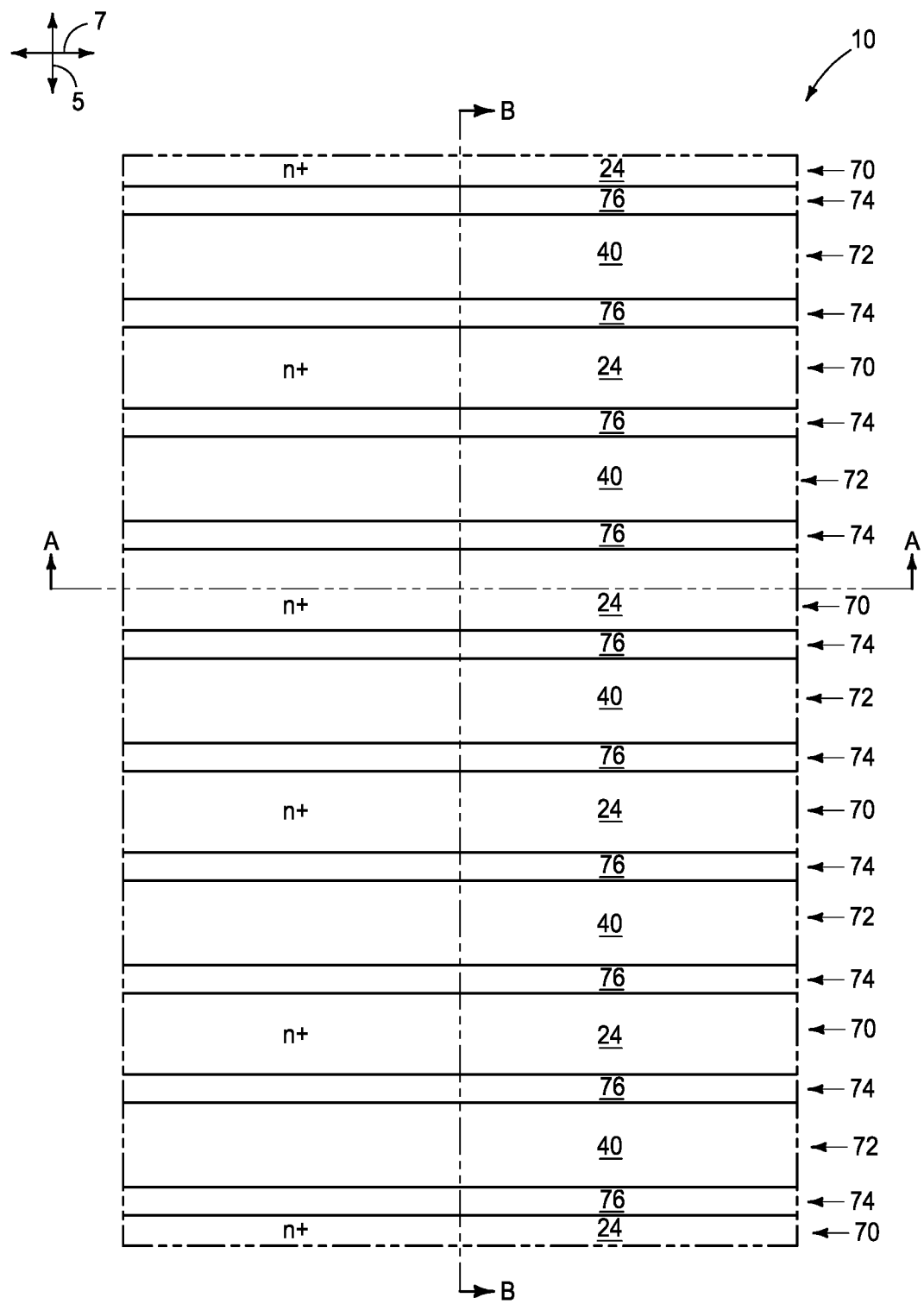
Figure 5A:
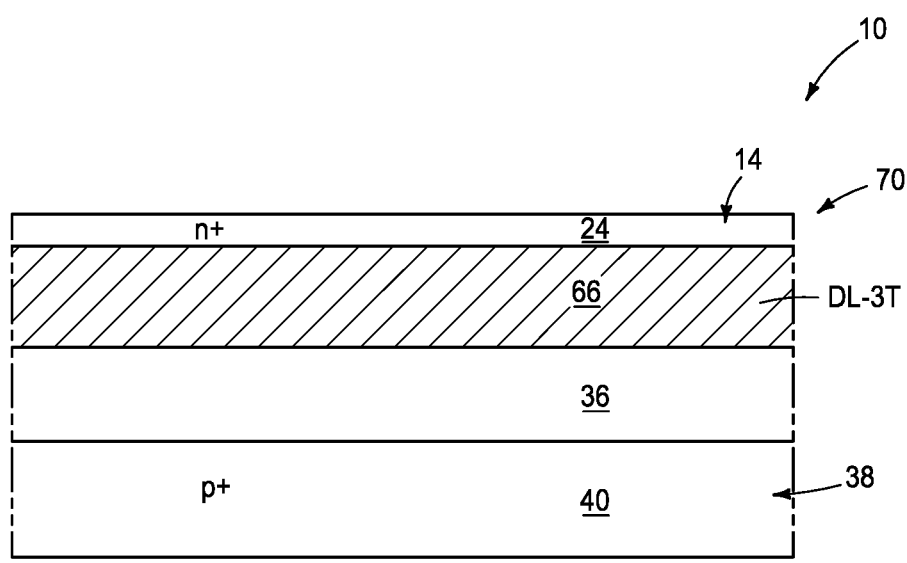
Figure 5B:
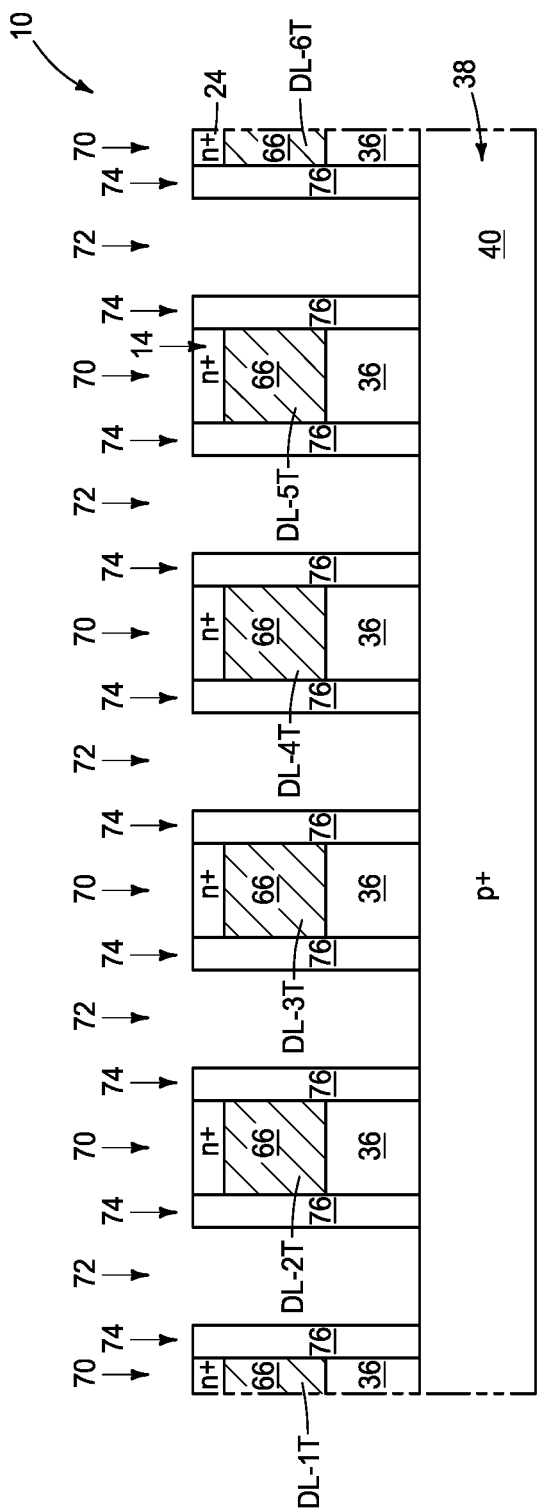

Referring to FIGS. 5-5B, insulative spacers 74 are formed along sidewalls of the rails 70. The insulative spacers comprise insulative material 76. The insulative material 76 may be any suitable insulative material. The insulative materials 36 and 76 may be a same composition as one another in some embodiments, and may be different compositions relative to one another in other embodiments. In some embodiments, the insulative materials 36 and 76 may both comprise, consist essentially of, or consist of silicon dioxide. In some embodiments, one of the insulative materials 36 and 76 may comprise silicon dioxide; while the other comprises high-k dielectric material or low-k dielectric material.

In some embodiments, the insulative spacers 74 may be referred to as first insulative spacers to distinguish them from other insulative spacers which are formed in subsequent process steps.

The insulative spacers 74 may be formed with any suitable processing. For instance, a layer of the material 76 may be provided to extend over the rails 70, along the sidewalls of the rails, and across the gaps 72; and then such layer may be anisotropically etched to form the spacers 74.

Figure 6:
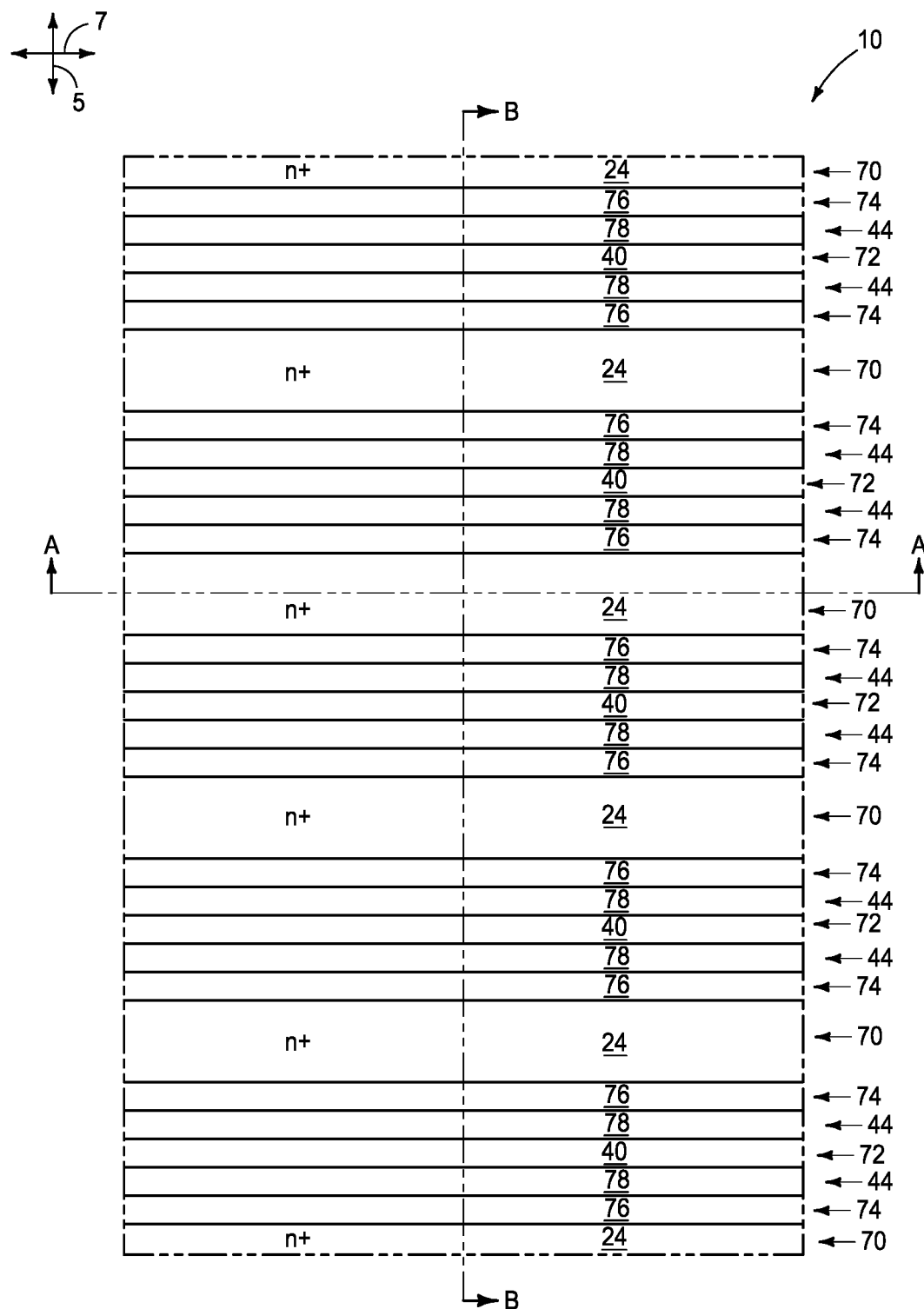
Figure 6A:
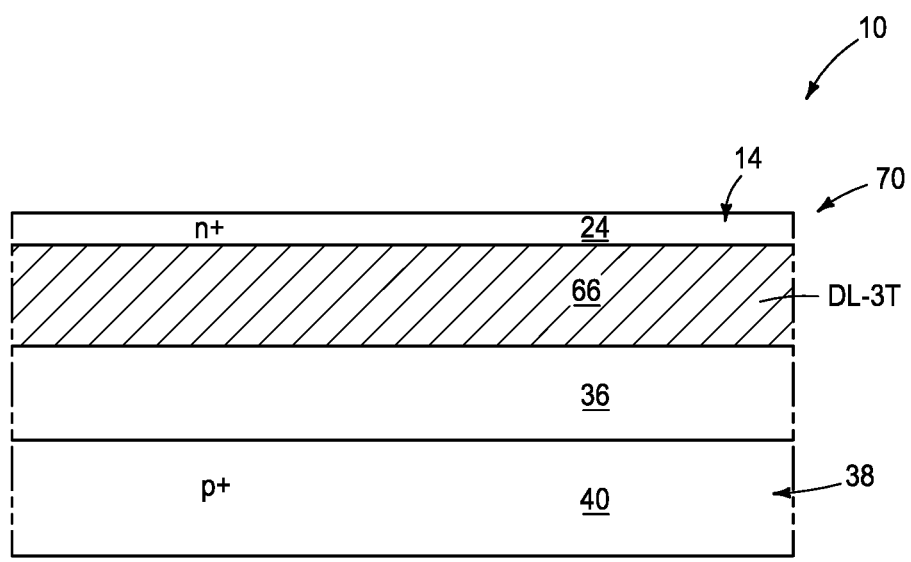
Figure 6B:
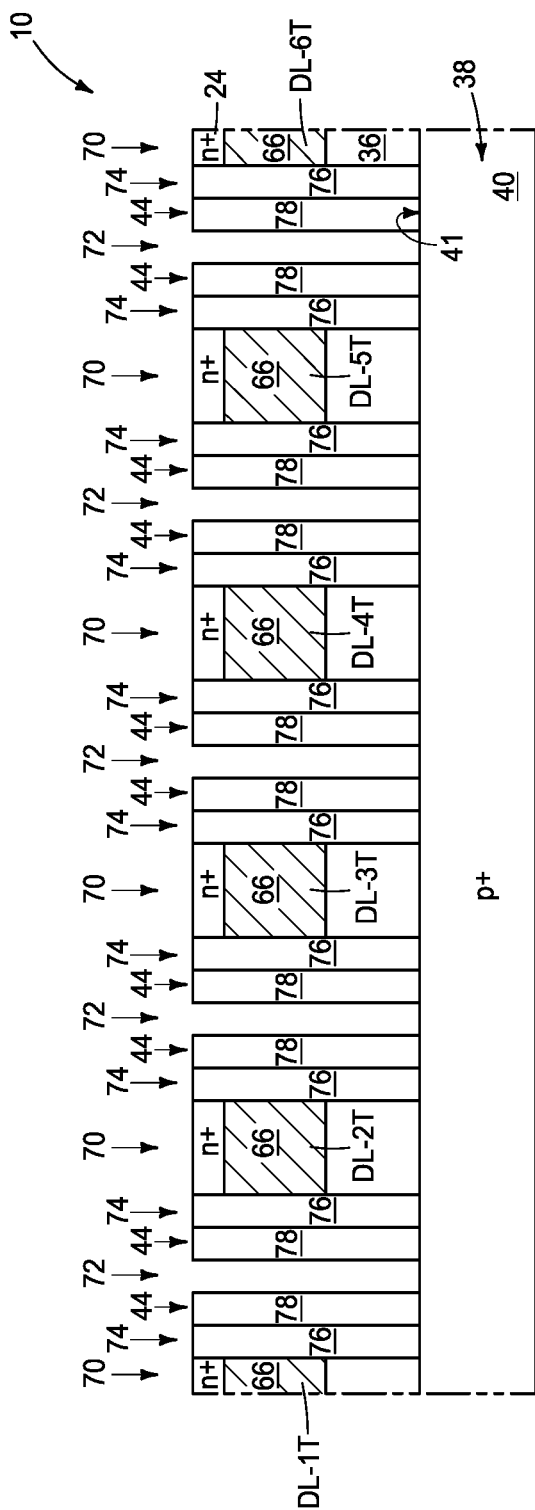

Referring to FIGS. 6-6B, semiconductor extensions 44 (i.e., extension regions) are formed along the insulative spacers 74. The semiconductor extensions 44 comprise semiconductor material 78. The semiconductor material 78 may be referred to as a third semiconductor material to distinguish it from the first and second semiconductor materials 40 and 24.

The semiconductor extensions 44 may be formed with any suitable processing. For instance, a layer of the semiconductor material 78 may be provided to extend over the rails 70, along sidewalls of the spacers 74, and across the gaps 72; and then such layer may be anisotropically etched to form the illustrated semiconductor extensions 44.

The semiconductor material 78 of the semiconductor extensions 44 directly contacts the upper surface 41 of the carrier-reservoir structure 38.

The semiconductor extensions 44 may be doped to any suitable dopant type and concentration; with example dopant types and concentrations being discussed above with reference to FIGS. 1-1B. The semiconductor material 78 of the extensions 44 may be the same composition as the semiconductor material 40 of the carrier-reservoir structure 38, or may be a different composition relative to the semiconductor material 40.

The semiconductor extensions 44 and spacers 74 narrow the gaps 72.

Figure 7:
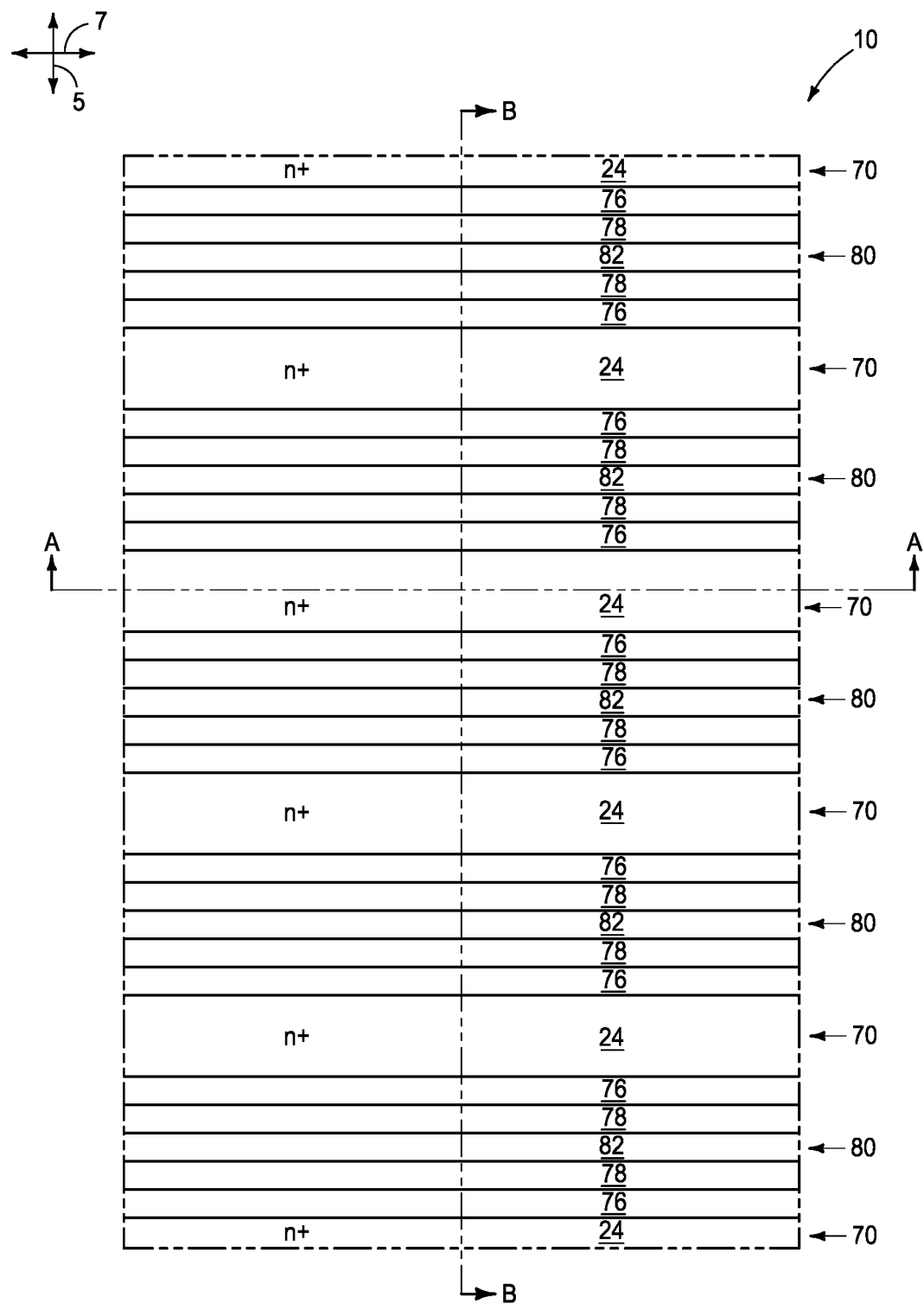
Figure 7A:
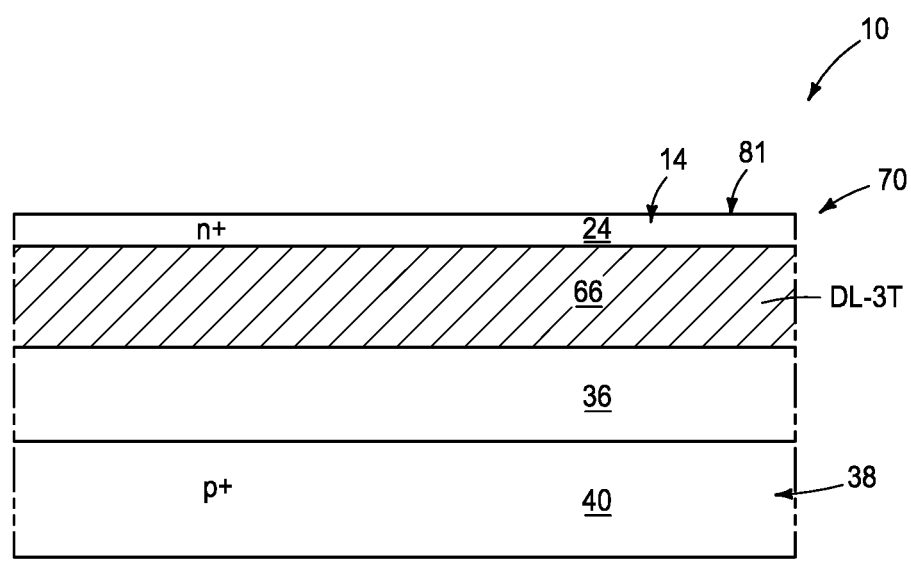

Referring to FIGS. 7-7B, insulative spacers 80 are formed within the narrowed gaps 72 (such narrowed gaps are shown in FIG. 6B). The insulative spacers 80 may be referred to as second spacers to distinguish them from the first insulative spacers 74.

The insulative spacers 80 comprise insulative material 82. The insulative material 82 may be the same as one or both of the insulative materials 76 and 36; or may be different than one or both of the insulative materials 76 and 36. In some embodiments, the insulative materials 36, 76 and 82 all comprise, consist essentially of, or consist of silicon dioxide.

A planarized surface 81 is formed to extend across the rails 70, the first insulative spacers 74, the semiconductor extensions 44 and the second insulative spacers 80. The planarized surface 81 may be formed utilizing any suitable processing; and in some embodiments may be formed utilizing chemical-mechanical polishing (CMP).

Figure 8:
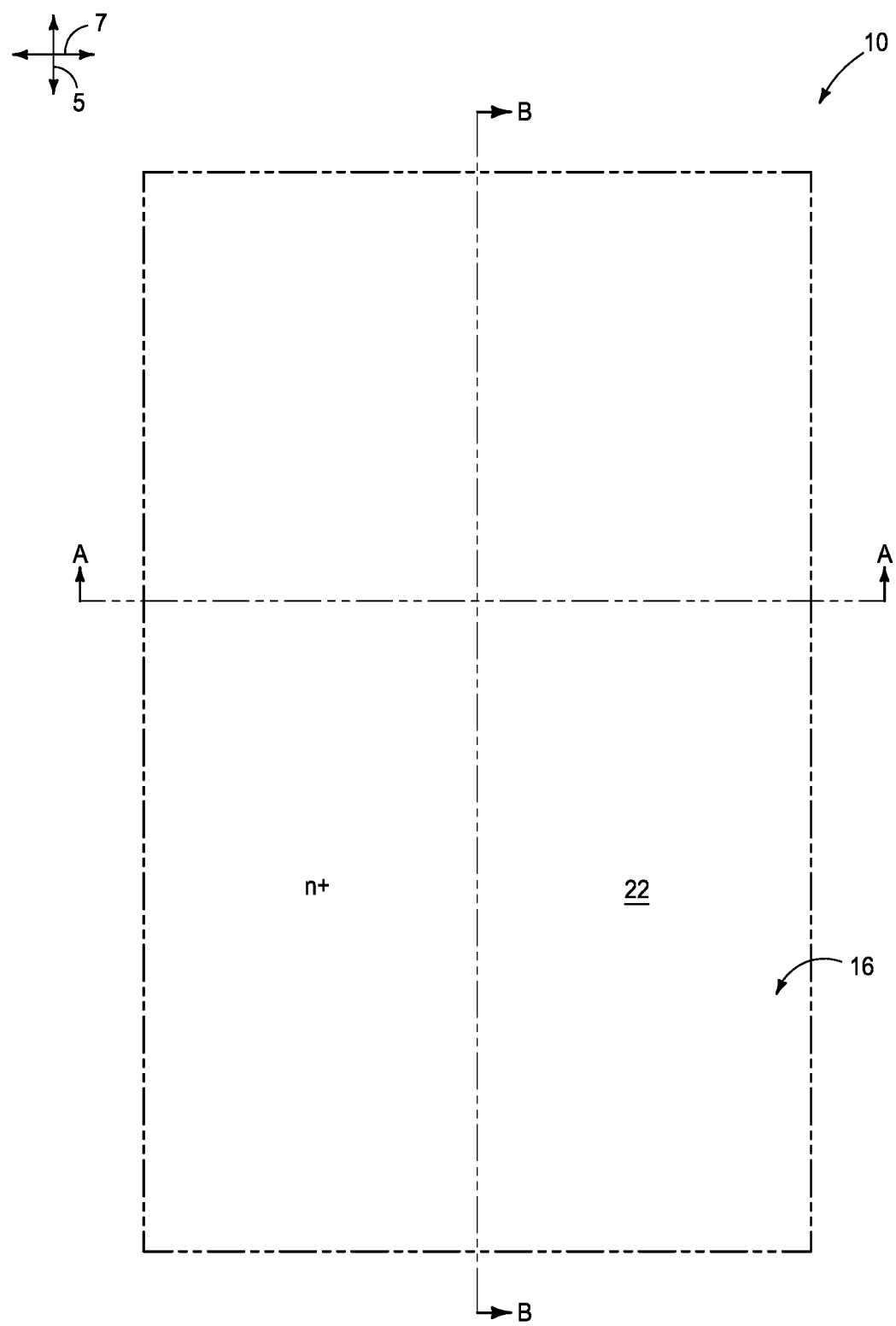
Figure 8A:
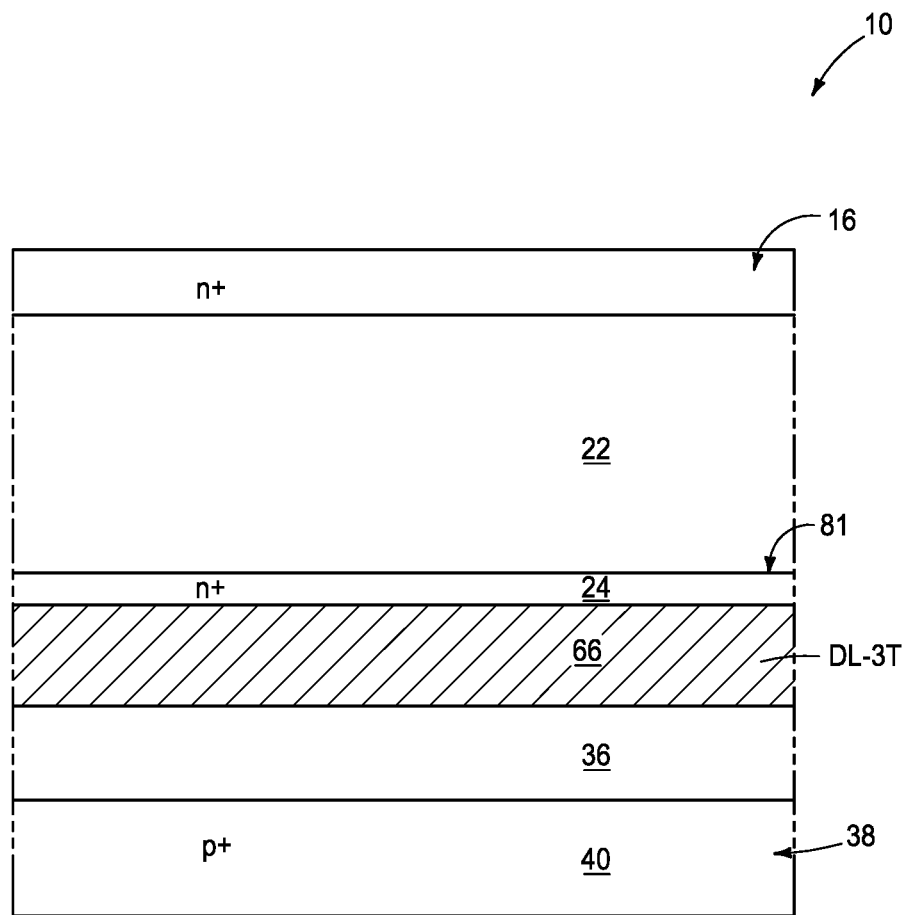
Figure 8B:
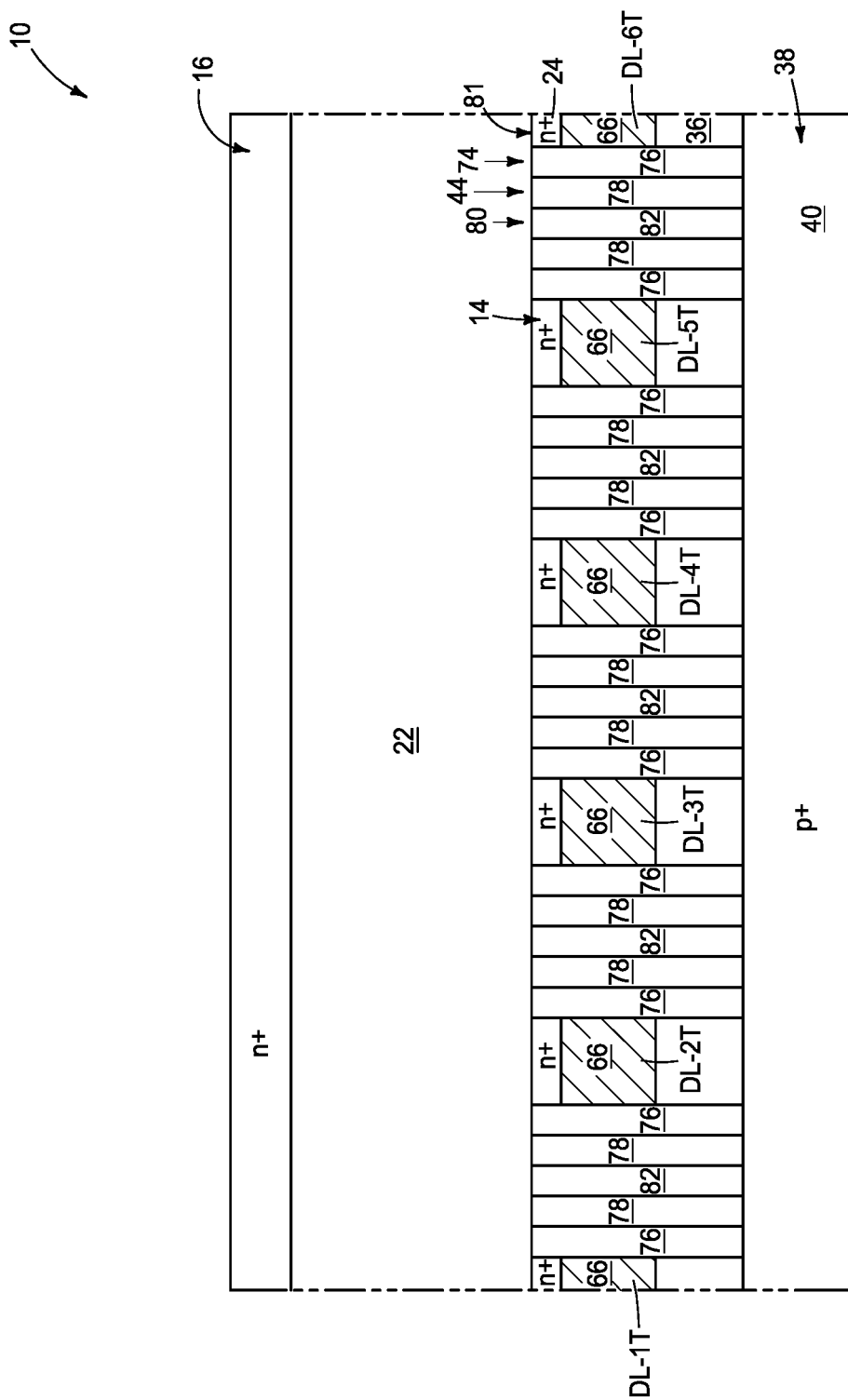

Referring to FIGS. 8-8B, semiconductor material 22 is formed over and directly against the planarized surface 81. The semiconductor material 22 may comprise the same composition(s) described above with reference to FIGS. 1-1B. In some embodiments, the semiconductor material 22 may be referred to as fourth semiconductor material to distinguish it from the first semiconductor material 40, second semiconductor material 24 and third semiconductor material 78. In some embodiments, the first, second, third and fourth semiconductor materials may all comprise a same composition as one another. For instance, the first, second, third and fourth semiconductor materials 40, 24, 78 and 22 may all comprise silicon. In other embodiments, at least one of the first, second, third and fourth semiconductor materials 40, 24, 78 and 22 may comprise a different composition relative to another of the first, second, third and fourth semiconductor materials 40, 24, 78 and 22. For instance, in some embodiments one of the first, second, third and fourth semiconductor materials 40, 24, 78 and 22 may comprise silicon, and another of such materials may comprise germanium, III/V semiconductor material or semiconductor oxide.

In the illustrated embodiment, an upper region of semiconductor material 22 is doped with dopant of the upper source/drain regions 16; with such upper source/drain regions being discussed above with reference to FIGS. 1-1B. The dopant within the upper source/drain regions 16 is shown to be n-type dopant, but in other embodiments may be p-type dopant.

Figure 9:
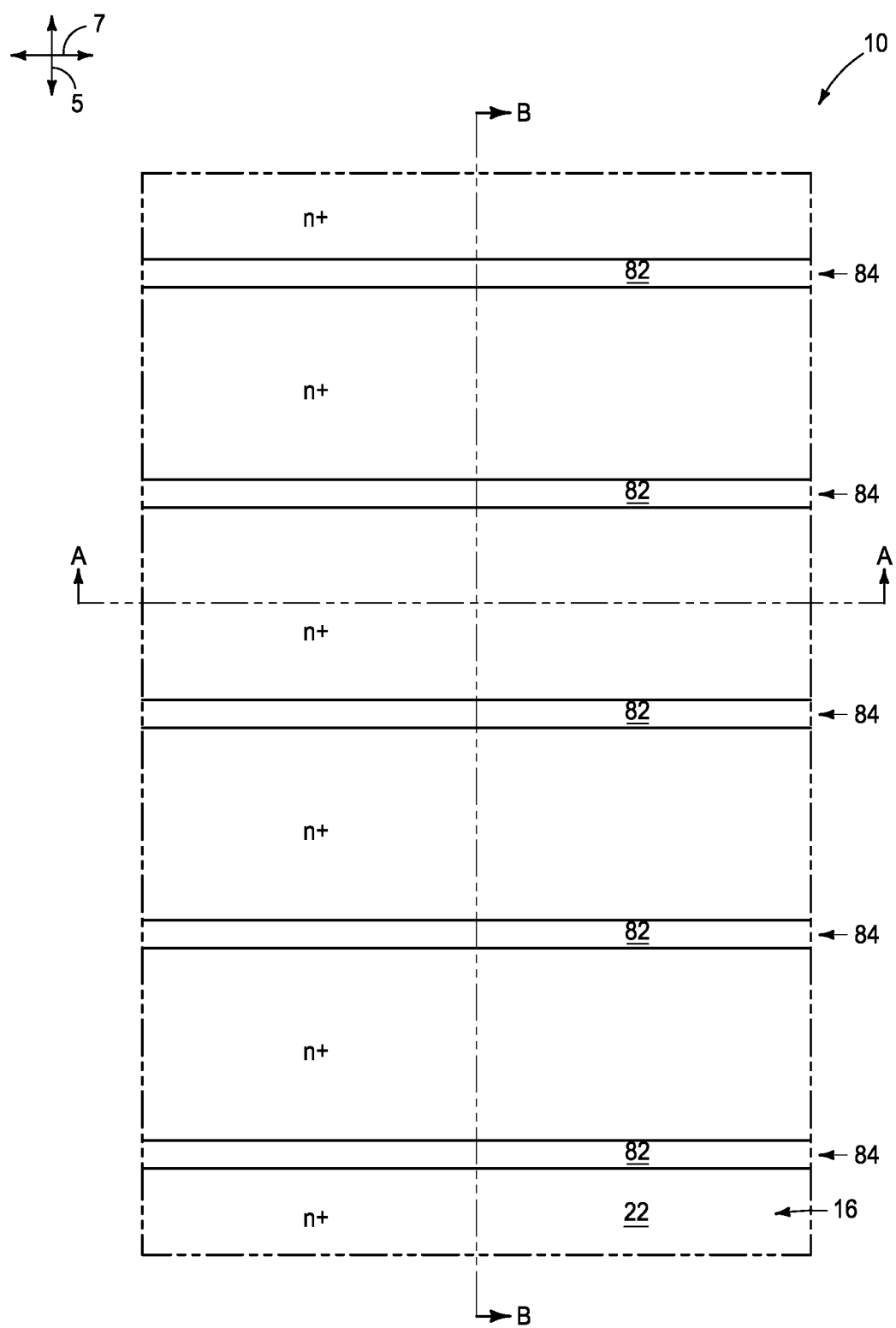
Figure 9A:
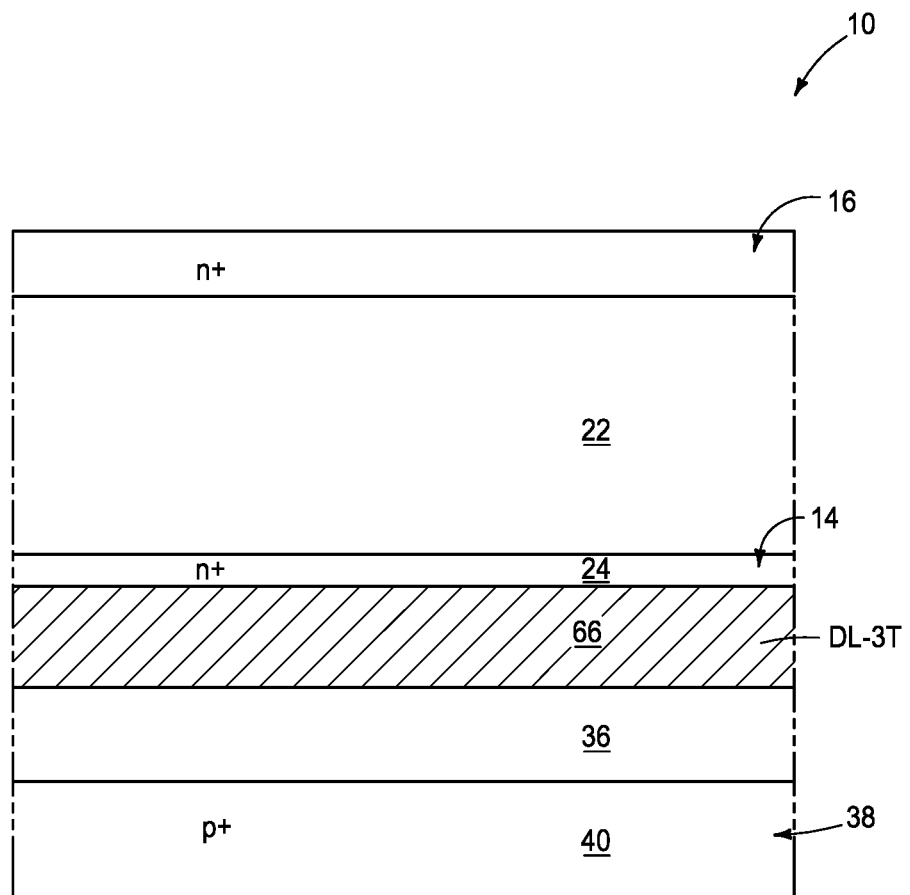
Figure 9B:
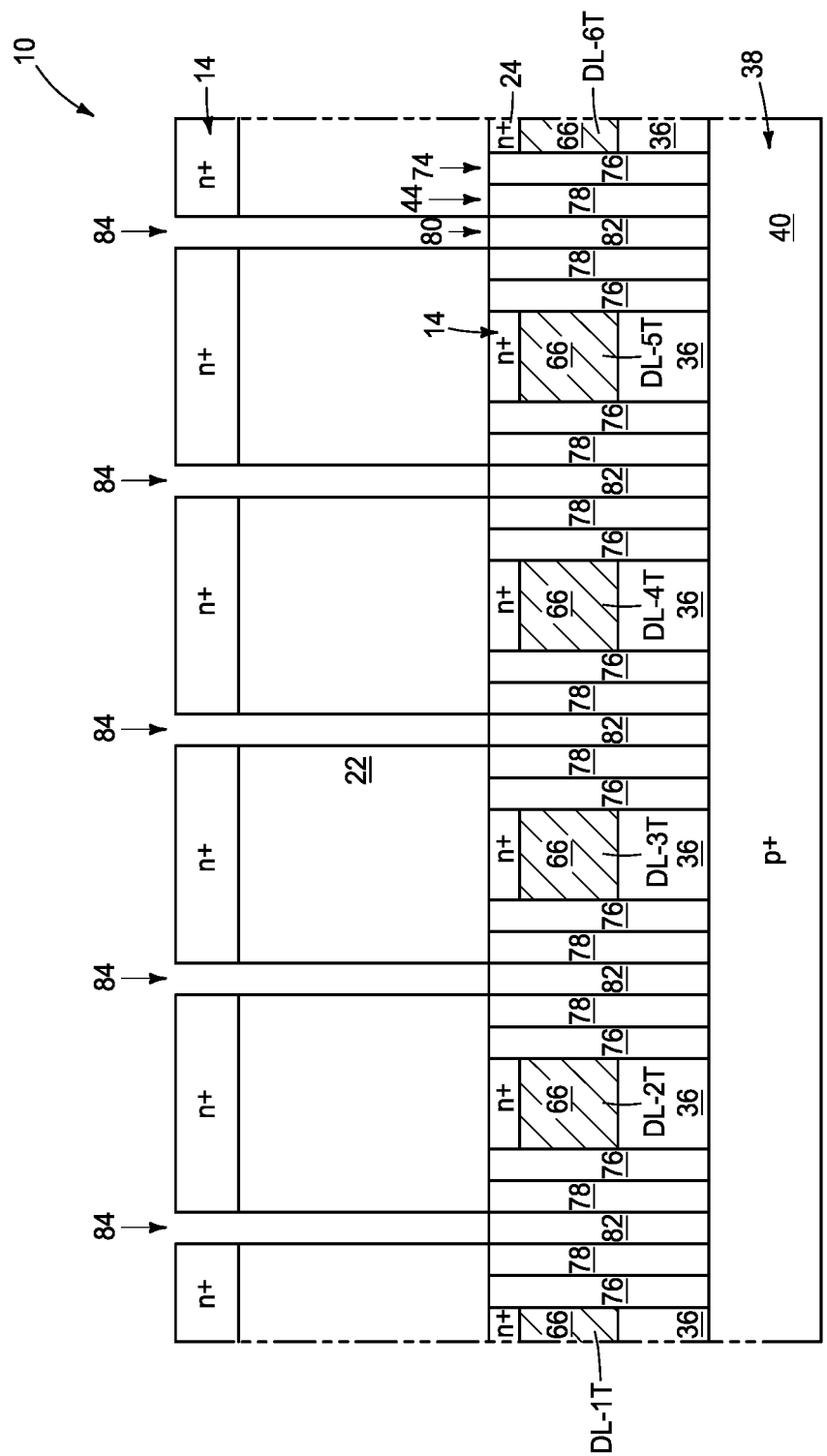

Referring to FIGS. 9-9B, slits 84 are formed to extend through the fourth semiconductor material 22 to the insulative spacers 80. The slits extend linearly along the direction of the axis 7 (shown relative to the top view of FIG. 9).

The slits 84 may be formed with any suitable processing. For instance, a patterned mask (not shown) may be provided over construction 10 to define locations of the slits, then the slits may be etched through material 22 with a suitable etch, and then the mask may be removed to leave the illustrated construction of FIGS. 9-9B.

Figure 10:
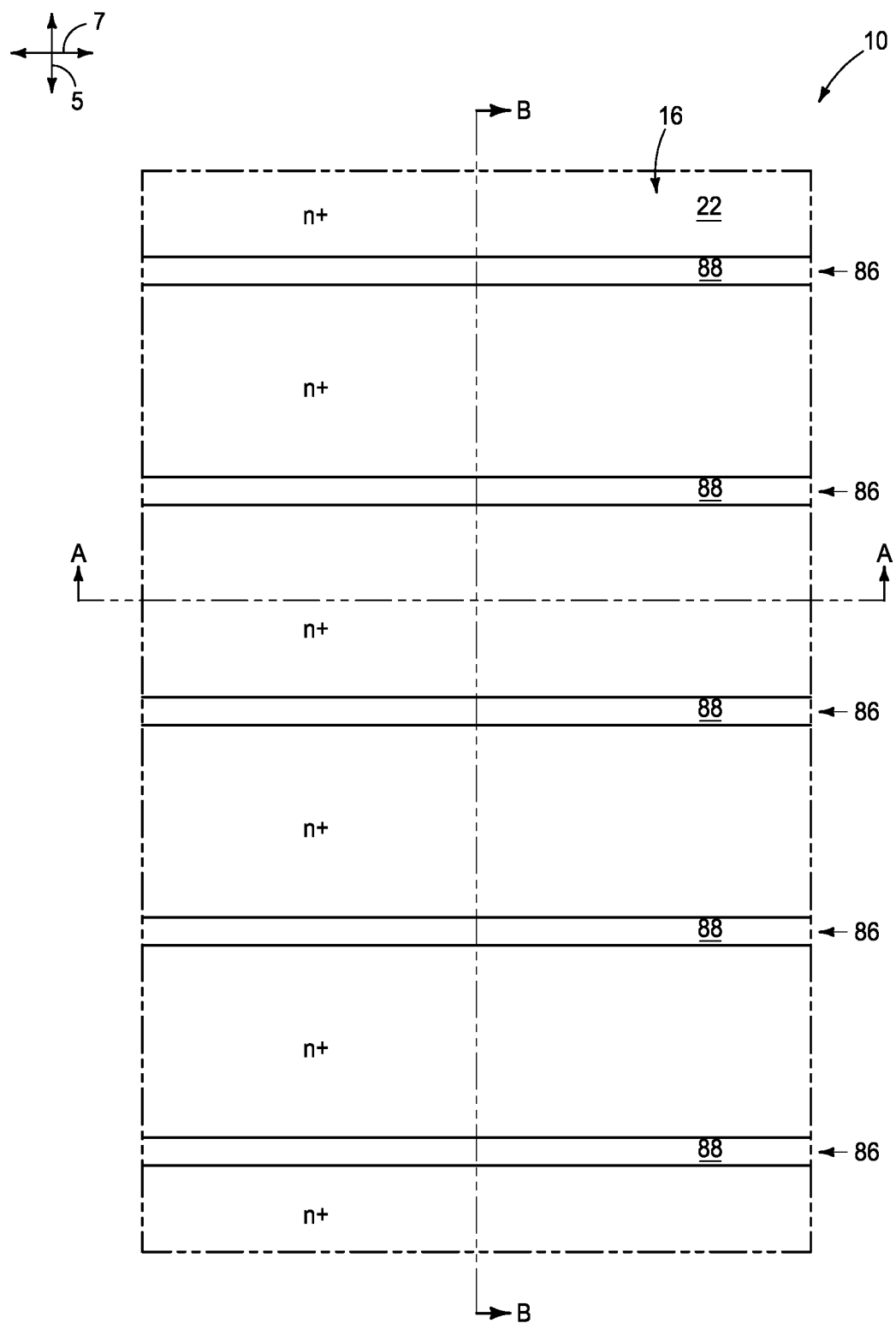
Figure 10A:
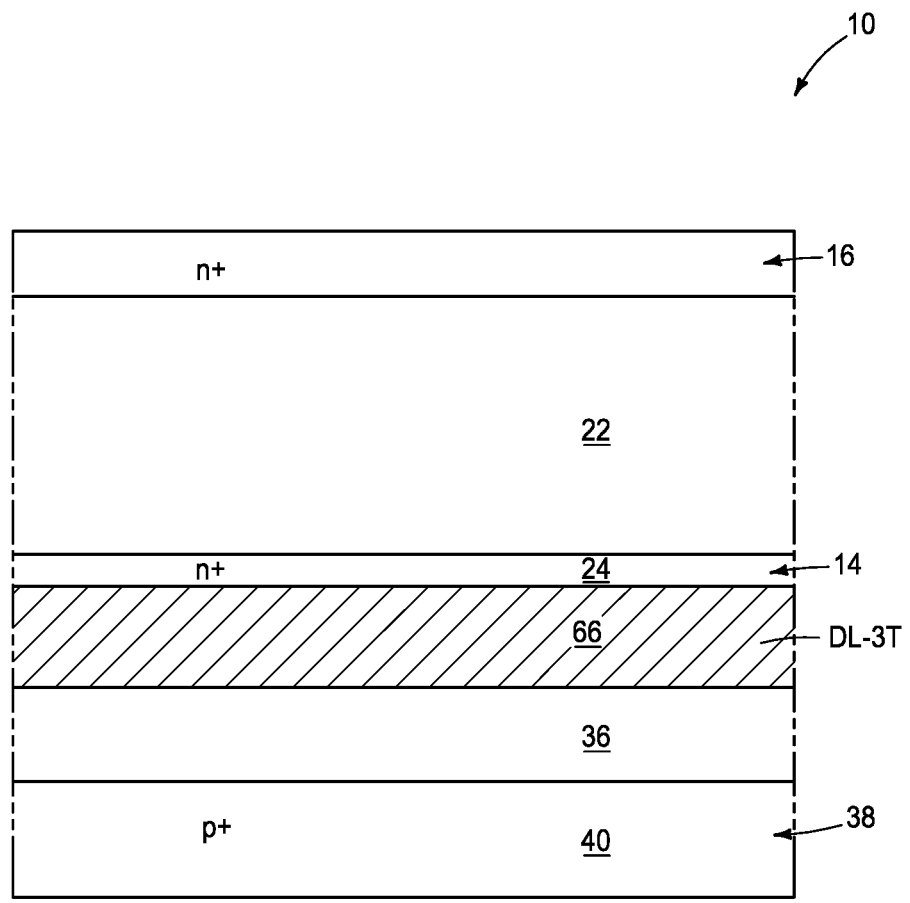
Figure 10B:
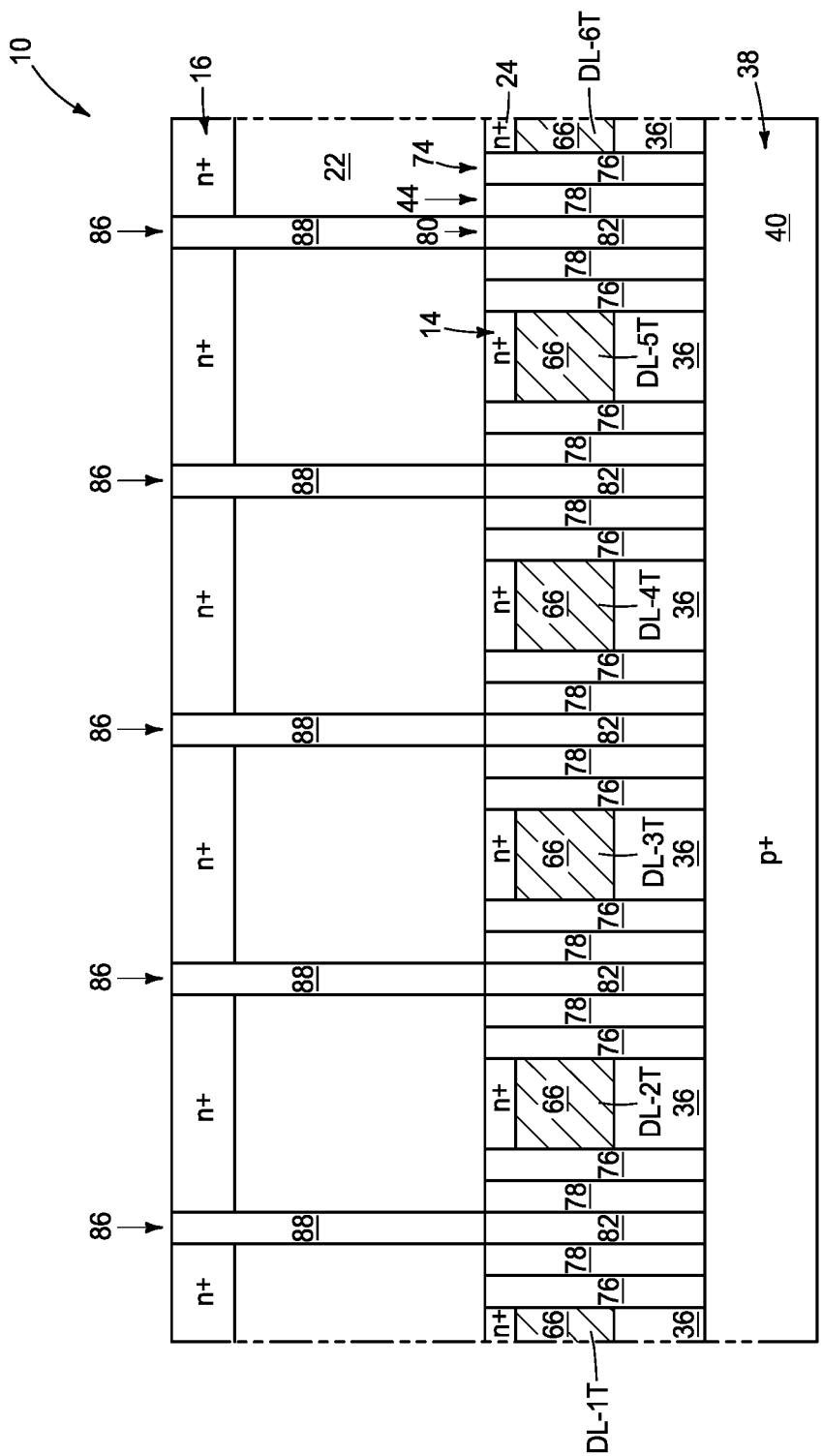

Referring to FIGS. 10-10B, insulative panels 86 are formed within the slits 84 (FIGS. 9-9B). The insulative panels 86 comprise insulative material 88. Such insulative material may comprise any suitable composition or combination of compositions. In some embodiments, the insulative materials 36, 76, 82 and 88 will be the same composition as one another; and may, for example, all comprise, consist essentially of, or consist of silicon dioxide. In other embodiments, at least one of the insulative materials 36, 76, 82 and 88 will be of a different composition relative to at least one other of the insulative materials 36, 76, 82 and 88. For instance, one of the materials 36, 76, 82 and 88 may comprise, consist essentially of, or consist of silicon dioxide; and another of the materials may comprise, consist essentially of, or consist of one or more of silicon nitride, aluminum oxide, low-k oxide, hafnium oxide, zirconium oxide, etc.

Figure 11:
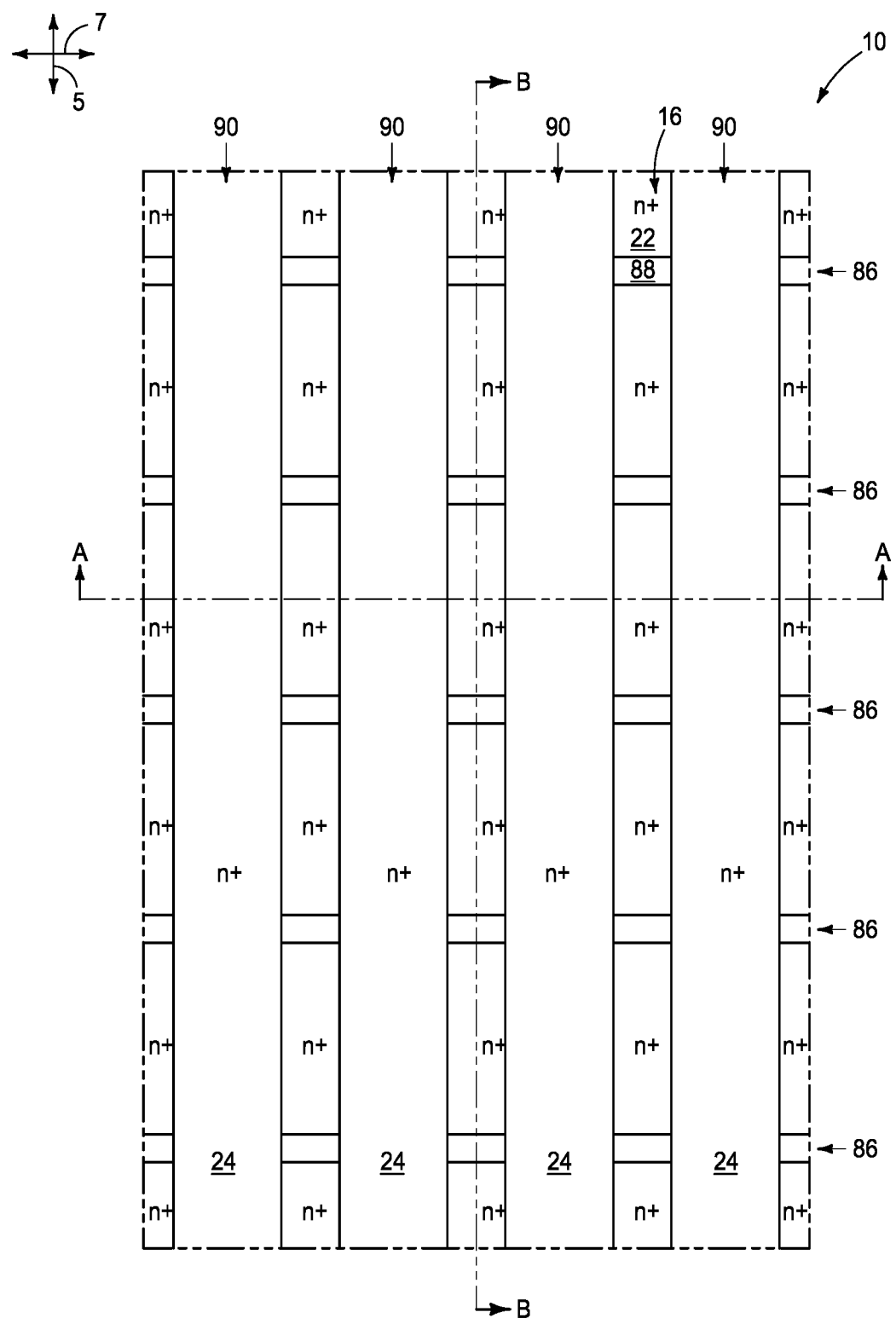
Figure 11A:
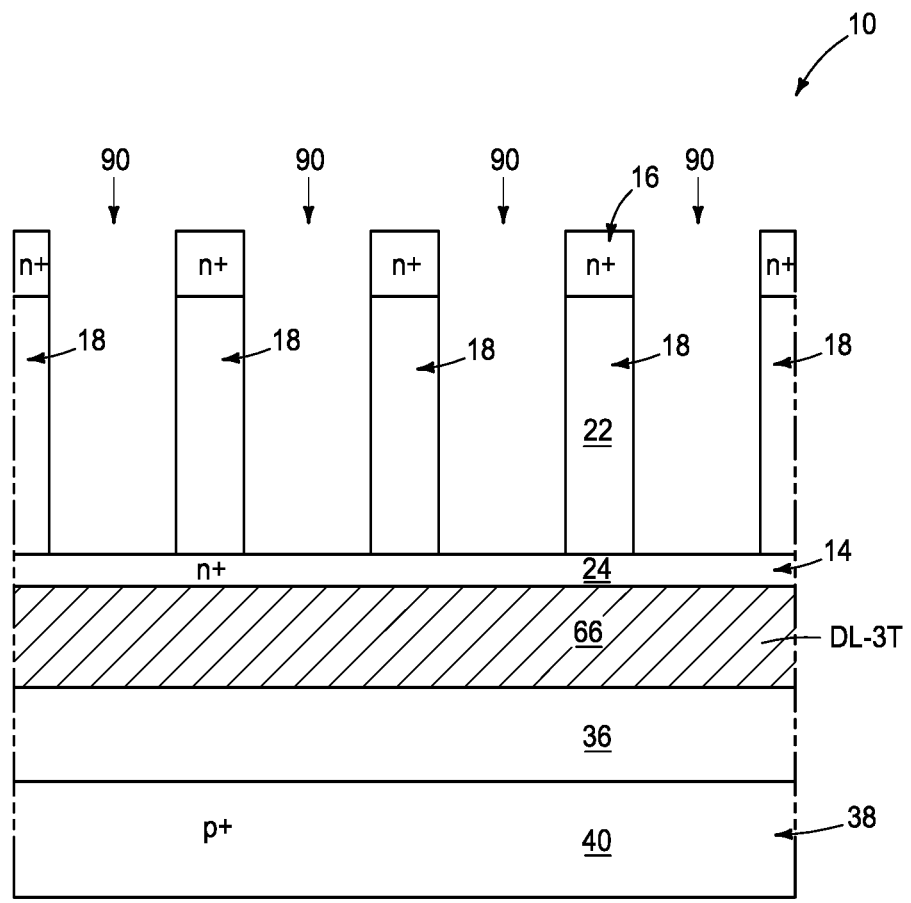
Figure 11B:
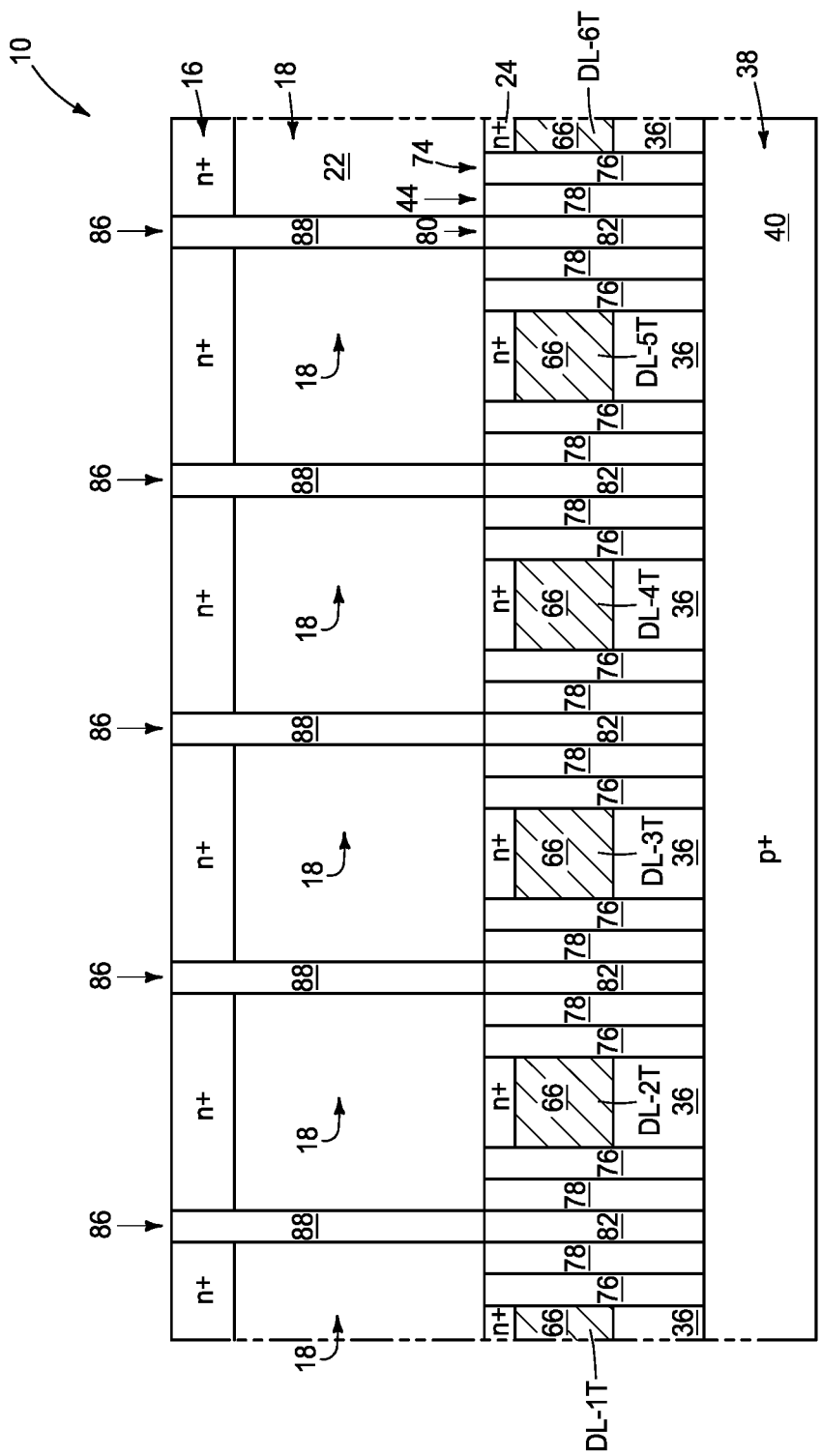

Referring to FIGS. 11-11B, trenches 90 are formed to extend through the fourth semiconductor material 22 and the insulative panels 86. The trenches 90 extend along the direction of axis 5 (shown relative to the top view of FIG. 11).

The trenches 90 may be formed with any suitable processing. For instance, a patterned mask (not shown) may be provided over construction 10 to define locations of the trenches 90; one or more etches may be utilized to form the trenches within the defined locations; and the mask may then be removed to leave the illustrated construction of FIGS. 11-11B.

The trenches 90 pattern the semiconductor material 22 into the transistor body regions 18 described above with reference to FIGS. 1-1B.

Figure 12:
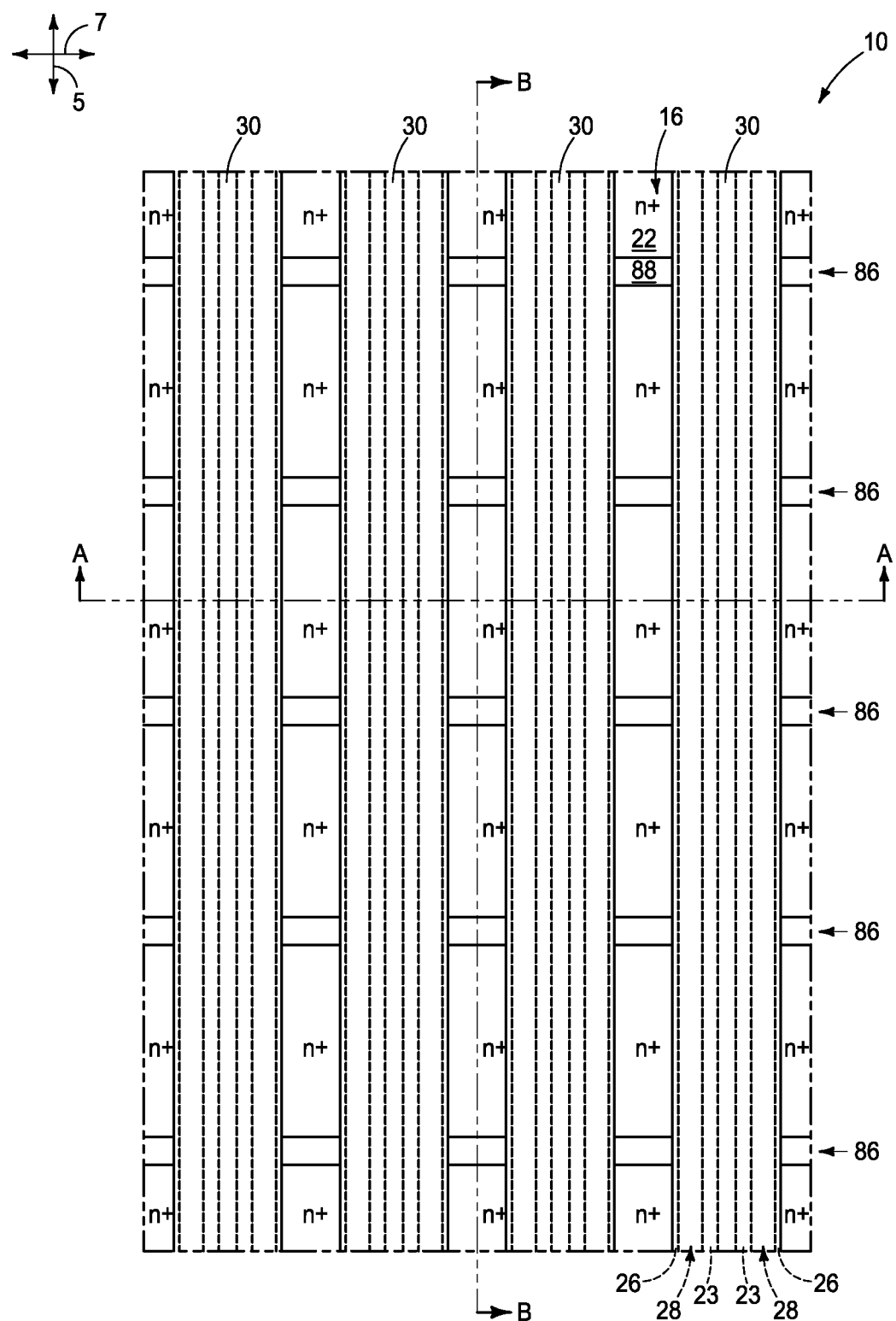
Figure 12A:
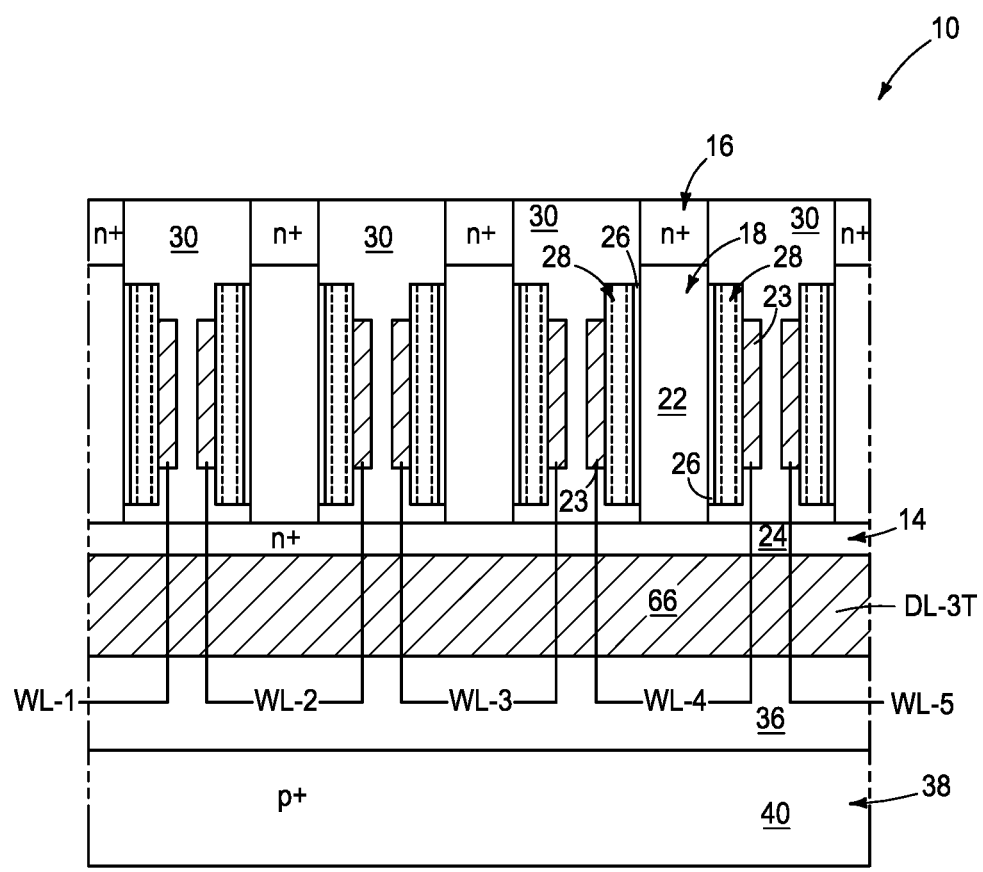
Figure 12B:
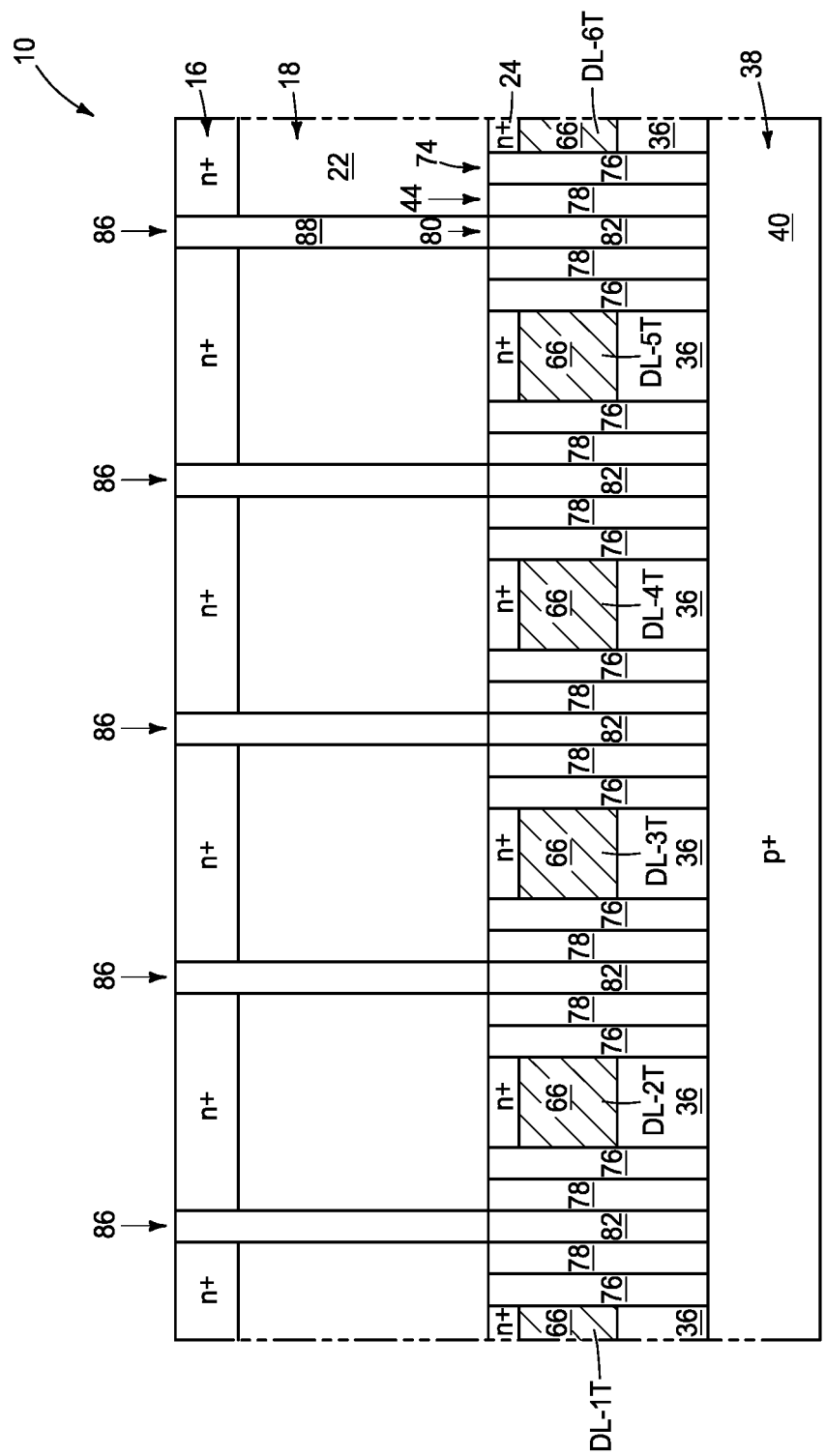

Referring to FIGS. 12-12B, gate dielectric material 26, MFM stacks 28, and conductive wordline material 23 are formed and patterned within the trenches 90 (with such trenches being shown in FIGS. 11-11B) to form structures analogous those described above with reference to FIGS. 1-1B. The materials may be formed and patterned within the trenches utilizing any suitable processing; either now known or yet to be developed. Persons of ordinary skill will readily recognize conventional methods which may be utilized to form the gate dielectric material 26, MFM stacks 28 and conductive wordline material 23 into structures analogous to, or substantially identical to, the illustrated structures of FIGS. 12-12B. The MFM stacks be utilized in MFMIS configurations. In some embodiments, the MFM stacks may be replaced with MF stacks suitable for utilization in MFIS configurations.

The wordline material 23 forms the wordlines WL-1, WL-2, WL-3, WL-4 and WL-5 described above with reference to FIGS. 1-1B.

The MFM stacks 28 comprise ferroelectric material and metal-containing materials of the types described above with reference to FIGS. 1-1B.

Figure 13:
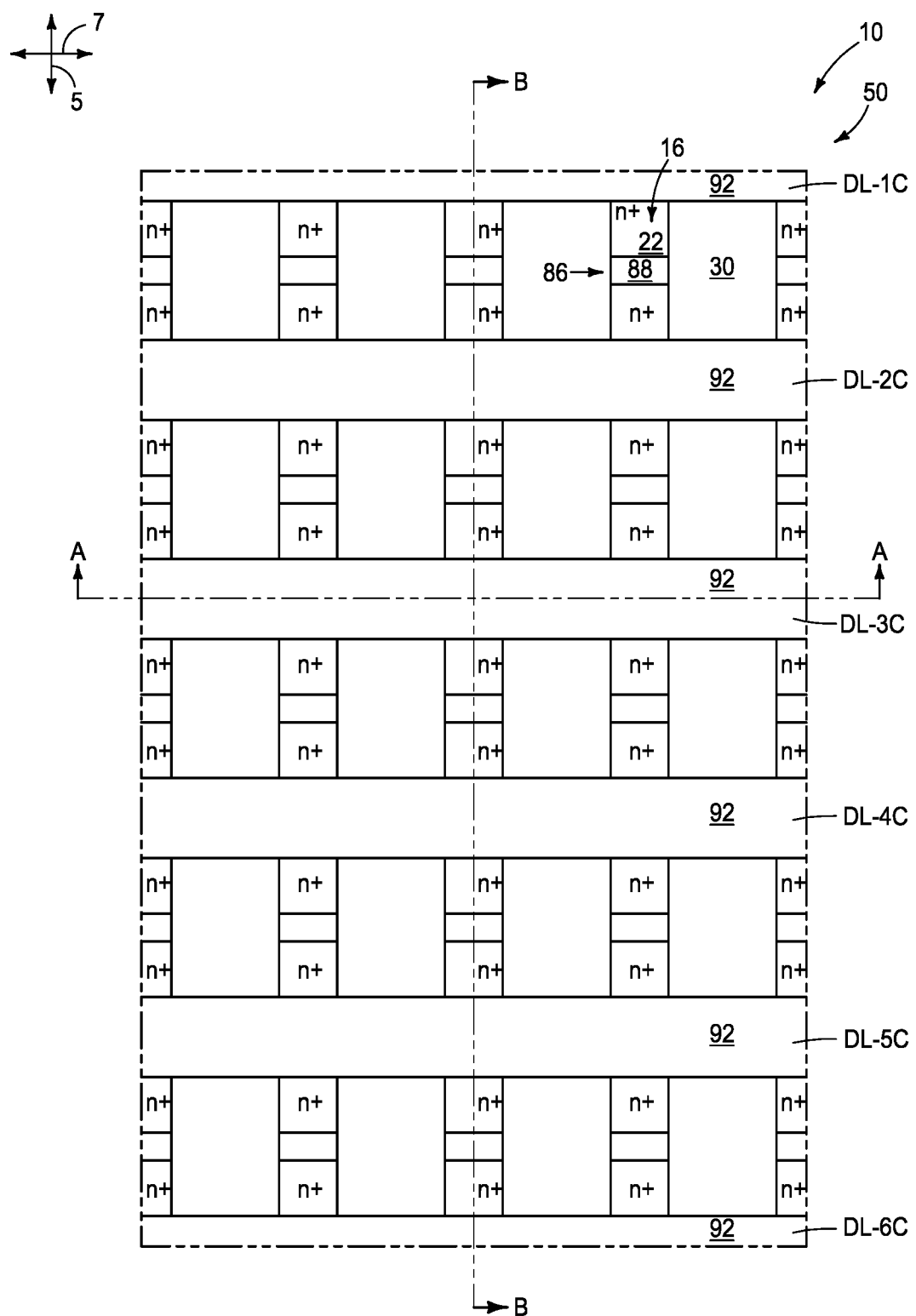
Figure 13A:
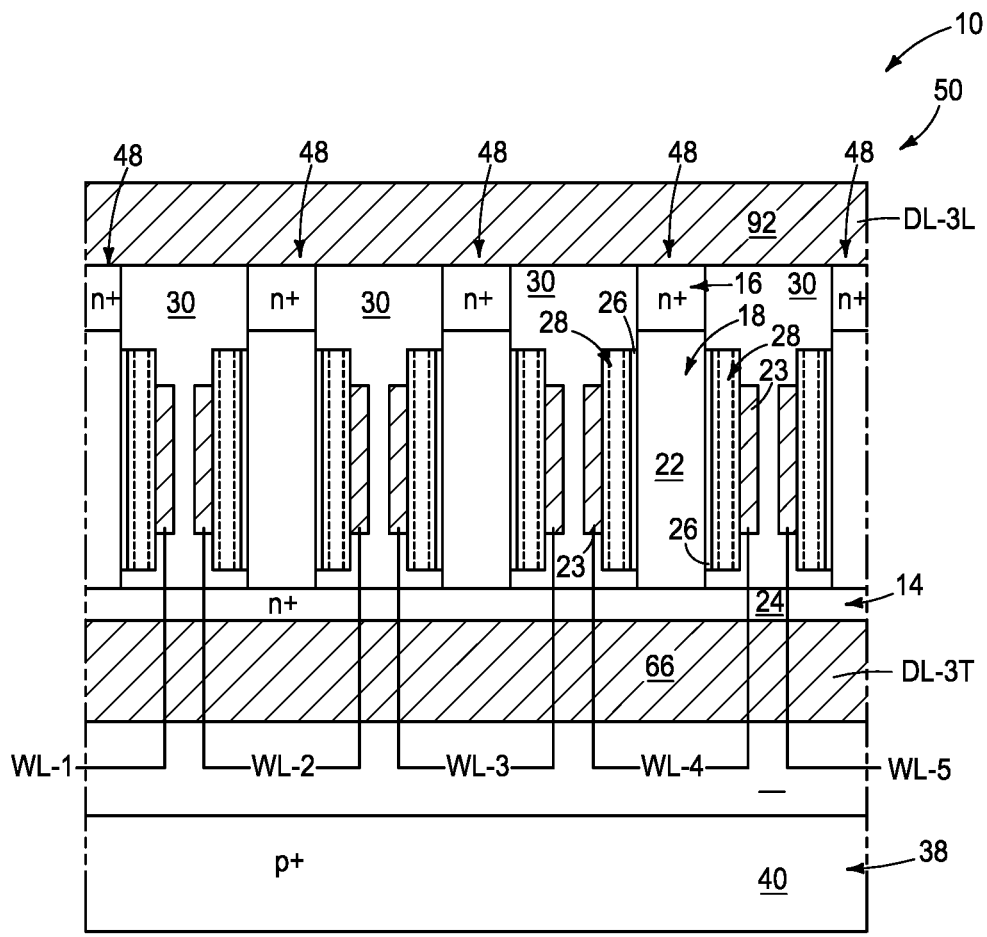
Figure 13B:
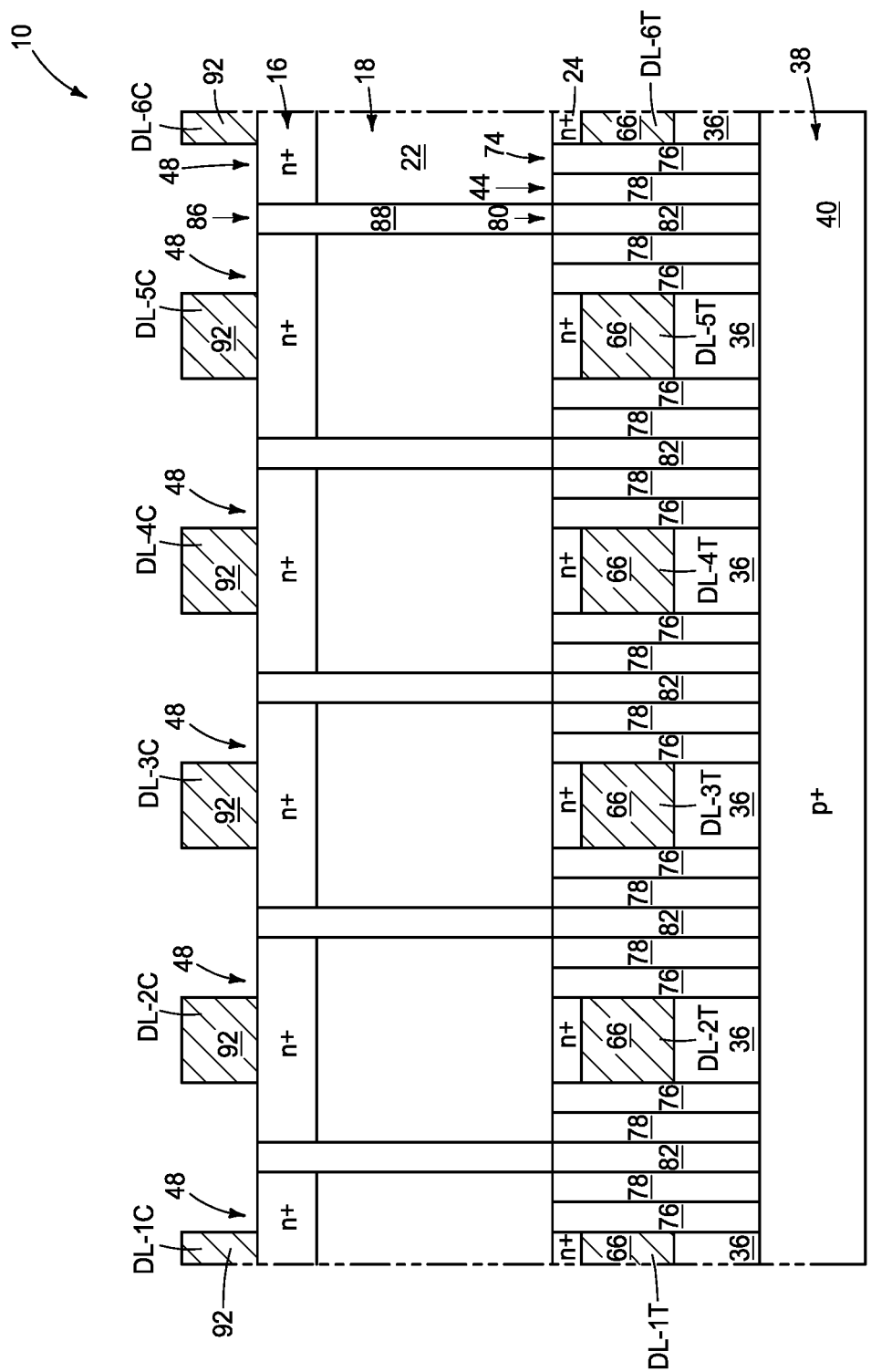

Referring to FIGS. 13-13B, digit-line material 92 is formed over the semiconductor material 22; and is patterned into the second comparative digit lines DL-1C, DL-2C, DL-3C, DL-4C, DL-5C and DL-6C. The digit-line material 92 may comprise any of the compositions described above relative to the digit-line material 66. In some embodiments, the digit-line materials 66 and 92 may be referred to as first and second digit-line materials, respectively. In some embodiments, both the first and second digit-line materials 66 and 92 may comprise metal; and accordingly, such may be referred to as first and second metal-containing-digit-line materials, respectively.

The second comparative digit lines DL-1C, DL-2C, DL-3C, DL-4C, DL-5C and DL-6C may be considered to be configured as rails extending along the direction of axis 7. In some embodiments, such rails may be referred to as second rails to distinguish them from the first rails 70 described above with reference to FIGS. 4-4B.

The second comparative digit lines DL-1C, DL-2C, DL-3C, DL-4C, DL-5C and DL-6C may be paired with the first comparative digit lines digit lines DL-1T, DL-2T, DL-3T, DL-4T, DL-5T and DL-6T in the manner described above with reference to FIGS. 1-1B.

The construction of FIGS. 13-13B comprises a memory array 50 having memory cells 48 of the type described above with reference to FIGS. 1-1B.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multi-chip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having a ferroelectric transistor body region between a first comparative digit line and a second comparative digit line. A carrier-reservoir structure is coupled with the ferroelectric transistor body region through an extension that passes along a side of the first comparative digit line.

Some embodiments include an integrated assembly having a conductive structure over a carrier-reservoir structure. A bottom surface of the conductive structure is spaced from the carrier-reservoir structure by an insulative region. A ferroelectric transistor is over the conductive structure. The ferroelectric transistor has a bottom source/drain region over and electrically coupled with the conductive structure, has a body region over the bottom source/drain region, and has a top source/drain region over the body region. An extension extends upwardly from the carrier-reservoir structure, along a side of the conductive structure, and to a bottom of the body region. The extension is configured to provide carriers from the carrier-reservoir structure to the body region.

Some embodiments include an integrated assembly having a carrier-reservoir structure. First comparative digit lines are over the carrier-reservoir structure. The first comparative digit lines extend along a first direction. Ferroelectric transistor body regions are over the first comparative digit lines. Extensions extend from the carrier-reservoir structure to the ferroelectric transistor body regions. The extensions are configured to provide carriers to the ferroelectric transistor body regions. Second comparative digit lines are over the ferroelectric transistor body regions. The second comparative digit lines extend along the first direction. Wordlines are adjacent the ferroelectric transistor body regions. The wordlines are spaced from the ferroelectric transistor body regions by intervening regions comprising ferroelectric material. The wordlines extend along a second direction which crosses the first direction. The ferroelectric transistor body regions are comprised by memory cells of a memory array. Each of the memory cells comprises one of the ferroelectric transistor body regions.

Some embodiments include a method of forming an integrated assembly. A stack is formed to comprise in ascending order a first semiconductor material, an insulative material and a second semiconductor material. The first semiconductor material is either p-type doped or n-type doped. The second semiconductor material is the other of p-type doped and n-type doped. The insulative material and the second semiconductor material are patterned into rails extending along a first direction. The rails are spaced from one another by gaps. Regions of the first semiconductor material are exposed along bottom peripheries of the gaps. The rails have sidewalls along the gaps. First insulative spacers are formed along the sidewalls of the rails. Semiconductor extensions are formed along the first insulative spacers. The semiconductor extensions comprise third semiconductor material and are directly against the regions of the first semiconductor material. The semiconductor extensions and the first insulative spacers narrow the gaps. Second insulative spacers are formed within the narrowed gaps. A planarized surface is formed to extend across the rails, the first insulative spacers, the semiconductor extensions and the second insulative spacers. Fourth semiconductor material is formed over and directly against the planarized surface. Slits are formed to extend through the fourth semiconductor material to the second insulative spacers. The slits extend linearly along the first direction. Insulative panels are formed within the slits. Trenches are formed to extend through the fourth semiconductor material and the insulative panels. The trenches extend along a second direction which crosses the first direction. The trenches pattern the fourth semiconductor material into transistor body regions. Ferroelectric material is formed along sidewalls of the transistor body regions. Wordlines are formed along the ferroelectric material. The wordlines extend along the second direction.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly, comprising:
a ferroelectric transistor structure comprising a pillar extending vertically between a first comparative digit line and a second comparative digit line, the pillar having a first source/drain region directly against the first comparative digit line, a second source/drain region directly against the second comparative digit line and a ferroelectric transistor body region between the first and second source/drain regions; and
a carrier-reservoir structure coupled with the ferroelectric transistor body region through an extension that passes along a side of the first comparative digit line.

2. The integrated assembly of claim 1 comprising an insulative material between the side of the first comparative digit line and the extension.

3. The integrated assembly of claim 1 wherein;
the ferroelectric transistor body region comprises a first semiconductor material;
the carrier-reservoir structure comprises a second semiconductor material;
the extension comprises a third semiconductor material; and
the first, second and third semiconductor materials are a same composition as one another.

4. The integrated assembly of claim 3 wherein the first, second and third semiconductor materials consist essentially of silicon.

5. The integrated assembly of claim 1 wherein;
the ferroelectric transistor body region comprises a first semiconductor material;
the carrier-reservoir structure comprises a second semiconductor material;
the extension comprises a third semiconductor material; and
at least one of the first, second and third semiconductor materials is a different composition than at least one other of the first, second and third semiconductor materials.

6. The integrated assembly of claim 1 wherein the carrier-reservoir structure is a reservoir of holes.

7. The integrated assembly of claim 6 wherein the carrier-reservoir structure is coupled with a negative reference voltage source.

8. The integrated assembly of claim 1 wherein the carrier-reservoir structure is a reservoir of electrons.

9. The integrated assembly of claim 8 wherein the carrier-reservoir structure is coupled with a positive reference voltage source.

10. An integrated assembly, comprising:
a conductive structure over a carrier-reservoir structure; a bottom surface of the conductive structure being spaced from the carrier-reservoir structure by an insulative region;
a ferroelectric transistor over the conductive structure; the ferroelectric transistor having a pillar comprising a bottom source/drain region directly over and electrically coupled with the conductive structure, the pillar having a body region directly over the bottom source/drain region and a top source/drain region directly over the body region; and
an extension that extends upwardly from the carrier-reservoir structure, along a side of the conductive structure, and to a bottom of the body region; the extension being configured to provide carriers from the carrier-reservoir structure to the body region.

11. The integrated assembly of claim 10 wherein the insulative region is a first insulative region, and further comprising a second insulative region between the side of the conductive structure and the extension.

12. The integrated assembly of claim 11 wherein the first and second insulative regions are a same composition as one another.

13. The integrated assembly of claim 11 wherein the first and second insulative regions are different compositions relative to one another.

14. The integrated assembly of claim 10 wherein the top and bottom source/drain regions are n-type doped, and wherein the carrier-reservoir structure is p-type doped.

15. The integrated assembly of claim 10 wherein the top and bottom source/drain regions are p-type doped, and wherein the carrier-reservoir structure is n-type doped.

16. An integrated assembly, comprising:
a carrier-reservoir structure;
first comparative digit lines over the carrier-reservoir structure; the first comparative digit lines extending along a first direction;
ferroelectric transistor body regions over the first comparative digit lines;
lower source/drain, regions vertically between the body regions and the first comparative digit line;
extensions extending along the lower source/drain regions from the carrier-reservoir structure to the ferroelectric transistor body regions; the extensions being configured to provide carriers to the ferroelectric transistor body regions;
second comparative digit lines over the ferroelectric transistor body regions; the second comparative digit lines extending along the first direction;
wordlines adjacent the ferroelectric transistor body regions, and spaced from the ferroelectric transistor body regions by intervening regions comprising ferroelectric material; the wordlines extending along a second direction which crosses the first direction; and
the ferroelectric transistor body regions being comprised by memory cells of a memory array; each of the memory cells comprising one of the ferroelectric transistor body regions.

17. The integrated assembly of claim 16 wherein the carrier-reservoir structure is a reservoir of holes.

18. The integrated assembly of claim 16 wherein the carrier-reservoir structure is a reservoir of electrons.

19. The integrated assembly of claim 16 wherein the carrier-reservoir structure comprises silicon doped to a concentration of at least about $1 \times 10^{20}$ atoms/cm$^3$ with p-type dopant or n-type dopant.

20. The integrated assembly of claim 19 wherein the extensions comprise silicon doped to a concentration of at least about $1 \times 10^{17}$ atoms/cm$^3$ with said p-type dopant or n-type dopant.

21. The integrated assembly of claim 16 wherein the extensions are spaced from the first comparative digit lines by insulative material.

22. The integrated assembly of claim 16 wherein the memory cells are first memory cells of a first memory deck; and further comprising one or more additional memory decks stacked relative to the first memory deck in a multi-deck architecture.

23. The integrated assembly of claim 22 wherein the ferroelectric transistor body regions of the first memory deck are first ferroelectric transistor body regions; and wherein at least one of said one or more additional memory decks comprises second memory cells which include second ferroelectric transistor body regions.

* * * * *